United States Patent
Noh et al.

(10) Patent No.: US 10,437,498 B2
(45) Date of Patent: Oct. 8, 2019

(54) ELECTRONIC DEVICE CONFIGURED TO RESET STORAGE DEVICE NON-DIRECTLY CONNECTED TO APPLICATION PROCESSOR AMONG STORAGE DEVICES SERIALLY CONNECTED TO ONE ANOTHER AND METHOD OF OPERATING THE SAME

(71) Applicant: Samsung Electronics Co., Ltd., Suwon-si, Gyeonggi-do (KR)

(72) Inventors: Kwanwoo Noh, Seoul (KR); Hyuntae Park, Suwon-si (KR); Sungho Seo, Seoul (KR); Hwaseok Oh, Yongin-si (KR); Youngmin Lee, Seoul (KR); JinHyeok Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 166 days.

(21) Appl. No.: 15/697,900

(22) Filed: Sep. 7, 2017

(65) Prior Publication Data
US 2018/0088854 A1    Mar. 29, 2018

(30) Foreign Application Priority Data
Sep. 28, 2016   (KR) .......................... 10-2016-0124749

(51) Int. Cl.
| | |
|---|---|
| *G06F 3/00* | (2006.01) |
| *G06F 3/06* | (2006.01) |
| *G06F 13/42* | (2006.01) |
| *G06F 11/07* | (2006.01) |
| *G11C 5/04* | (2006.01) |

(52) U.S. Cl.
CPC .......... *G06F 3/0634* (2013.01); *G06F 3/0632* (2013.01); *G06F 13/4239* (2013.01); *G06F 13/4247* (2013.01); *G06F 3/0611* (2013.01); *G06F 11/0787* (2013.01); *G11C 5/04* (2013.01)

(58) Field of Classification Search
CPC ...... G06F 3/0634; G06F 3/0611; G06F 3/061; G06F 3/0628; G06F 3/0629; G06F 3/0632; G06F 13/4239; G06F 13/4247; G06F 13/4265; G06F 13/4282; G06F 11/0787; G11C 5/04; G11C 5/06
USPC ........................................................ 714/23
See application file for complete search history.

(56) References Cited

U.S. PATENT DOCUMENTS

| | | | |
|---|---|---|---|
| 5,463,772 A | 10/1995 | Thompson et al. | |
| 6,230,181 B1 * | 5/2001 | Mitchell | ................. G06F 9/442 714/E11.138 |
| 6,438,684 B1 * | 8/2002 | Mitchell | ................... G06F 1/24 713/1 |

(Continued)

*Primary Examiner* — Anthony J Amoroso
(74) *Attorney, Agent, or Firm* — Harness, Dickey & Pierce, P.L.C.

(57) ABSTRACT

An electronic device includes an application processor; and a first storage device that is, connected to the application processor and directly communicates with the application processor, and connected to a second storage device such that the second storage device communicates with the application processor through the first storage device, wherein the first storage device includes a reset converter configured to generate a software reset signal in response to a hardware reset signal received from the application processor, and wherein the software reset signal resets the second storage device.

20 Claims, 19 Drawing Sheets

(56) References Cited

U.S. PATENT DOCUMENTS

| | | | |
|---|---|---|---|
| 6,991,173 B2* | 1/2006 | Fruhauf | G06F 1/24 |
| | | | 235/492 |
| 7,296,097 B2 | 11/2007 | Kanamori et al. | |
| 8,452,936 B2* | 5/2013 | Nguyen | G06F 3/0605 |
| | | | 709/208 |
| 8,527,810 B1 | 9/2013 | Carter et al. | |
| 8,595,552 B2 | 11/2013 | Yamagami | |
| 2010/0172049 A1* | 7/2010 | Lee | G06F 3/0626 |
| | | | 360/55 |
| 2010/0237913 A1* | 9/2010 | Nishioka | G06F 1/24 |
| | | | 327/143 |
| 2011/0119476 A1 | 5/2011 | Dai | |
| 2014/0136766 A1 | 5/2014 | Smith et al. | |
| 2014/0304458 A1 | 10/2014 | Chyan et al. | |
| 2016/0034203 A1 | 2/2016 | Jang et al. | |
| 2016/0070320 A1* | 3/2016 | Ravirala | G06F 1/24 |
| | | | 714/23 |
| 2016/0135095 A1 | 5/2016 | Wu | |
| 2016/0154700 A1 | 6/2016 | Tian et al. | |
| 2017/0139721 A1* | 5/2017 | Feehrer | G06F 9/4418 |

* cited by examiner

ELECTRONIC DEVICE CONFIGURED TO RESET STORAGE DEVICE NON-DIRECTLY CONNECTED TO APPLICATION PROCESSOR AMONG STORAGE DEVICES SERIALLY CONNECTED TO ONE ANOTHER AND METHOD OF OPERATING THE SAME

CROSS-REFERENCE TO RELATED APPLICATIONS

This U.S. non-provisional patent application claims priority under 35 U.S.C. §119 to Korean Patent Application No. 10-2016-0124749, filed on Sep. 28, 2016, in the Korean Intellectual Property Office (KIPO), the entire contents of which are hereby incorporated by reference.

BACKGROUND

1. Field

At least some example embodiments of the inventive concepts relate to electronic devices, and more particularly, to a method of resetting a storage device not directly connected to an application processor in an electronic device including storage devices having a cascade connection structure.

2. Related Art

Various types of electronic devices such as a smart phone, a desktop computer, a laptop computer, a tablet PC, a wearable device, etc. are being widely used these days. Those electronic devices usually include a storage device for storing data. In particular, as those electronic devices become high speed and high capacity, there have been a lot of efforts for increasing capacity of a storage device and improving a speed of the storage device of an electronic device. As part of those efforts, various protocols for performing an interfacing between an application processor and a storage device of an electronic device have been adopted.

SUMMARY

According to at least some example embodiments of the inventive concepts, an electronic device includes an application processor; and a first storage device that is, connected to the application processor and directly communicates with the application processor, and connected to a second storage device such that the second storage device communicates with the application processor through the first storage device, wherein the first storage device includes a reset converter configured to generate a software reset signal in response to a hardware reset signal received from the application processor, and wherein the software reset signal resets the second storage device.

According to at least some example embodiments of the inventive concepts, an embedded storage device configured to connect to, and directly communicate with, an application processor, includes a reset converter configured to generate a software reset signal in response to a hardware reset signal received from the application processor, wherein the reset converter is configured to transmit the software reset signal to a removable storage device, wherein the embedded storage device is connected to, and configured to directly communicate with, the removable storage device, and wherein the embedded storage device is configured to be a connection between the removable storage device and the application processor.

According to at least some example embodiments of the inventive concepts, an electronic device includes an application processor; one or more first signal lines; a first storage device connected to the application processor by the one or more first signal lines such that the first storage device is configured to receive a first reset signal from the application processor through the one or more first signal lines; and one or more second signal lines that are connected to the first storage device and connectable to a second storage device, wherein, the first storage device is configured such that, while the first storage device is connected to the second storage device by the one or more second signal lines, the first storage device generates a second reset signal based on the first reset signal, and the first storage device sends the second reset signal to the second storage device via the one or more second signal lines, the second reset signal being a signal configured to cause the second storage device to perform a reset operation.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
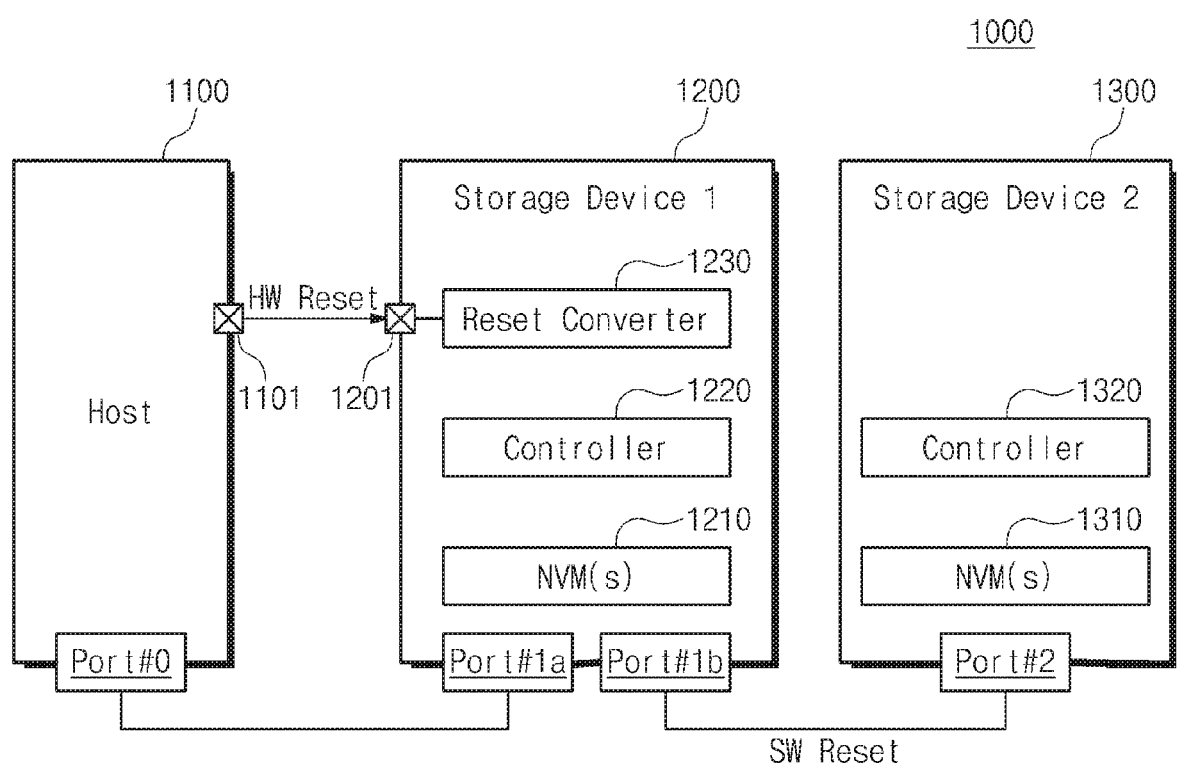
FIG. 1 is a block diagram illustrating a storage system including storage devices serially connected to one another according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a storage system 1000 including storage devices serially connected to one another according to at least some example embodiments of the inventive concepts. The storage system 1000 may include a host 1100, a first storage device 1200, and a second storage device 1300.

The host 1100 can manage and process an overall operation of the storage system 1000. For example, the host 1100 may transmit a command for performing a read operation or a write operation with respect to the first storage device 1200 and the second storage device 1300. The host 1100 may include at least one process core. The host 1100 may be embodied through a circuit for exclusive use such as a FPGA (field programmable gate array), a ASICs (application specific integrated circuit), etc. or be embodied by a SoC (system on chip). The host 1100 may include a general-purpose processor, a dedicated processor, or an application processor. According to at least some example embodiment of the inventive concepts, a processor included in the host 1100 may be a microprocessor, a multi-processor, and/or a multicore processor.

The first storage device 1200 may include at least one nonvolatile memory 1210 and a controller 1220. The second storage device 1300 may include at least one nonvolatile memory 1310 and a controller 1320.

The nonvolatile memories 1210 and 1310 may include memory cell arrays for storing data. In the case where memory cell arrays of the nonvolatile memories 1210 and 1310 are embodied by a NAND flash memory, the nonvolatile memories 1210 and 1310 may include three-dimensional memory cell arrays where a NAND string is vertically formed on a substrate. However, a configuration of the nonvolatile memories 1210 and 1310 may include at least one of various nonvolatile memories such as a PRAM (phase-change random access memory), a MRAM (magneto-resistive RAM), a ReRAM (resistive RAM), a FRAM (ferro-electric RAM), etc.

The controllers 1220 and 1320 can control an overall operation of the storage devices 1200 and 1300, respectively. To this end, each of the controllers 1220 and 1320 may include at least one processor or processor core and a buffer memory. According to at least some example embodiments of the inventive concepts, processors included in the controllers 1220 and 1320 may each be a microprocessor, a multi-processor, and/or a multicore processor. The controllers 1220 and 1320 can control the nonvolatile memories 1210 and 1310 respectively. Under the control of the controllers 1220 and 1320, read data may be stored in the nonvolatile memories 1210 and 1310 or read data may be output from the nonvolatile memories 1210 and 1310, respectively.

According to at least some example embodiments of the inventive concepts, the host 1100, the first storage device 1200, and the second storage device 1300 may be serially connected to one another. For example, the host 1100, the first storage device 1200, and the second storage device 1300 may be connected in the form of the topology of a chain structure or a cascade-connection structure.

Referring to FIG. 1, the host 1100 may be connected to directly communicate with the first storage device 1200 through ports (Port#0, Port#1a). For example, the host 1100 may be directly connected to the controller 1220 through the ports (Port#0, Port#1a) and thereby read data or write data may be exchanged between the host 1100 and the first storage device 1200. Here, the read data may be data read from the first storage device 1200 or the second storage device 1300 and the write data may be data to be written in the first storage device 1200 or the second storage device 1300.

However, the host 1100 may not directly communicate with the second storage device 1300. Thus, the host 1100 may include only the port (Port#0) connected to the first storage device 1200, a communication circuit for communicating with the first storage device 1200, and a peripheral circuit that controls the communication circuit, and the host 1100 may not include ports and peripheral circuits for communicating with the second storage device 1300.

The first storage device 1200 may be connected to directly communicate with the second storage device 1300 through ports (Port#1b, Port#2). For example, the first storage device 1200 is directly connected to the controller 1320 through the ports (Port#1b, Port#2). Read data or write data may be exchanged between the first storage device 1200 and the second storage device 1300 through the ports (Port#1b, Port#2). Here, the read data may be data read from the second storage device 1300 and the write data may be data to be written in the second storage device 1300.

The first storage device 1200 may include the port (Port#1b) for communicating with the second storage device 1300 in addition to the port (Port#1a) for communicating with the host 1100. For example, the controller 1220 can control (e.g., perform) an operation needed to perform a communication with the second storage device 1300.

According to such a configuration, a configuration of the host 1100 may become simplified and an area occupied by the host 1100 may be reduced. In addition, design and production costs of the host 1100 may be reduced. In addition to the economic benefits, adopting two storage devices 1200 and 1300 may provide larger storage capacity as compared with adopting one storage device. Thus, a user's data capacity requirements are more likely to be satisfied.

In at least the example shown in FIG. 1, a configuration of the first storage device 1200 may become more complicated. For example, according to at least some example embodiments of the inventive concepts, the communication circuit and peripheral circuit for controlling the communication circuit may be included in the first storage device 1200. In numerous cases, the host 1100 may operate at a speed of several to several tens of GHz and the first storage device 1200 may operate at a speed of several to several tens of MHz. In addition, a process for manufacturing the host 1100 may be more difficult and complicated than a process for manufacturing the first storage device 1200. Thus, embodying the port (PORT#1*b*), the communication circuit, and the peripheral circuit in the first storage device 1200 may be substantially simpler and more cost effective, for example, in comparison to manufacturing the host 1100 with multiple ports and other circuits for communicating, directly, with multiple storage devices.

The host 1100 and the storage devices 1200 and 1300 may communicate with each other according to at least one of various interface protocols. For example, the host 1100 and the storage devices 1200 and 1300 may adopt at least one of serial interface protocols such as a USB (universal serial bus), a SCSI (small computer system interface), a PCIe (peripheral component interconnect express), a SATA (serial advanced technology attachment), a SAS (serial attachment SCSI), a SD (Secure Digital) card, an eMMC (embedded MultiMediaCard), a UFS (universal flash storage) to communicate with each other.

The first storage device 1200 may further include a reset converter 1230. According to at least some example embodiments of the inventive concepts, the reset converter 1230 may be implemented by hardware (e.g., a circuit or circuitry of the first storage device), software (e.g., a microprocessor and/or the controller 1220 executing program code), or a combination of hardware and software. The reset converter 1230 may receive a hardware reset signal (HW Reset) from the host 1100. For example, the hardware reset signal (HW Reset) may be received through a separate line that connects reset pins 1101 and 1201 included in the host 1100 and the first storage device 1200 respectively. Components (e.g., the nonvolatile memory 1210, the controller 1220, and/or the ports (Port#1*a*, Port#1*b*)) of the first storage device 1200 may be reset by the hardware reset signal (HW Reset).

The reset converter 1230 may generate a software reset signal (SW Reset) in response to the hardware reset signal (HW Reset). The software reset signal (SW Reset) may be a command for resetting the second storage device 1300. The software reset signal (SW Reset) may be transmitted to the second storage device 1300 through the ports (Port#1*b*, Port#2). A reset of the second storage device 1300 may be executed before or after a reset of the first storage device 1200. A reset of the second storage device 1300 may be performed with respect to not only the nonvolatile memory 1310 but also various layers that constitute the controller 1320.

FIGS. 2A through 2D are views illustrating an embodiment of a storage system 1000 of FIG. 1.

Figure 2A:
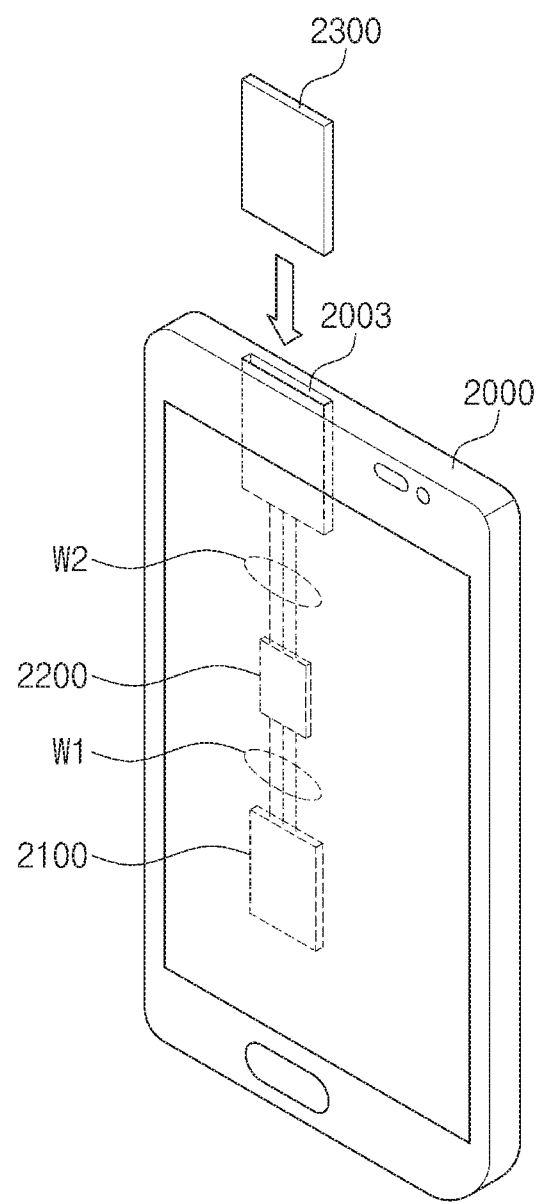
FIGS. 2A through 2D are views illustrating an embodiment of a storage system of FIG. 1.

Referring to FIG. 2A, the storage system 1000 of FIG. 1 may be embodied in an electronic device (e.g., a smart phone, a wearable device, a tablet computer, etc.) 2000. The electronic device 2000 may include an application processor 2100 and an embedded storage device 2200. The electronic device 2000 may include a slot 2003 for installing a removal storage device 2300. The removal storage device 2300 may be embodied in the form of a card, a stick, or a chip package, and may be built in the slot 2003 or be detachable (e.g., removable) from the slot 2003.

The application processor 2100 may be connected to directly communicate with the embedded storage device 2200 through a conductive pattern W1. According to at least some example embodiments, the term "conductive pattern" may refer to a pattern of electrically conductive material that embodies, for example, one or more signal lines for transmitting signals (e.g., commands and/or data). In the case where the removal storage device 2300 is installed in the slot 2003, the embedded storage device 2200 may be connected to directly communicate with the removal storage device 2300 through a conductive pattern W2. The removal storage device 2300 may not be directly connected to the application processor 2100.

Figure 2B:
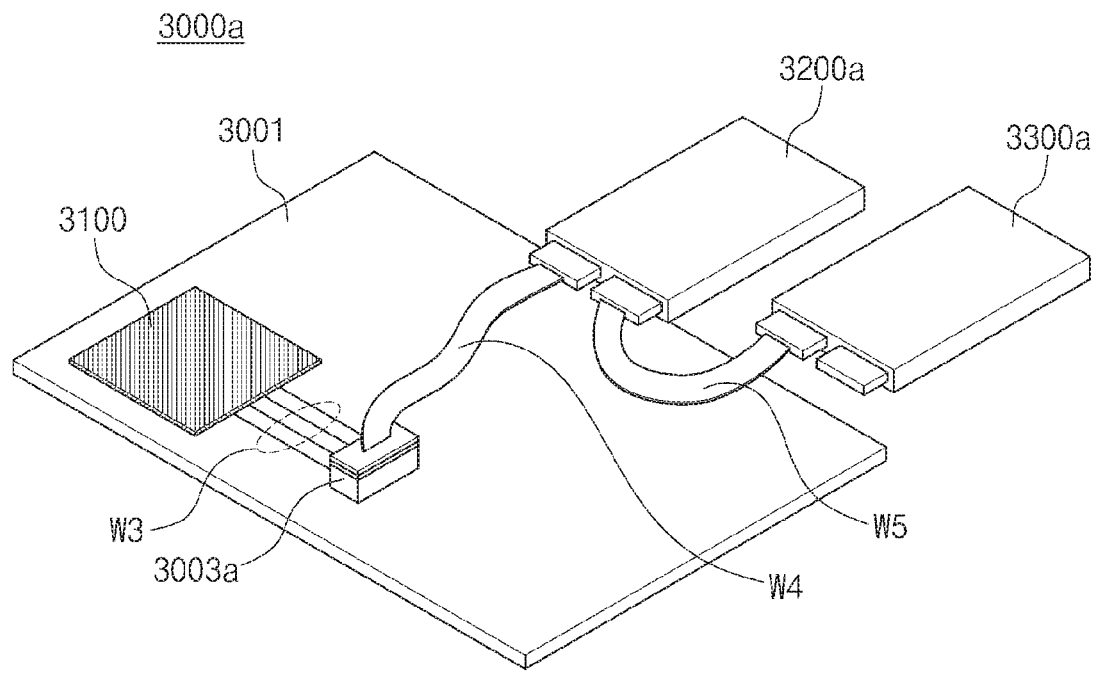
Figure 2C:
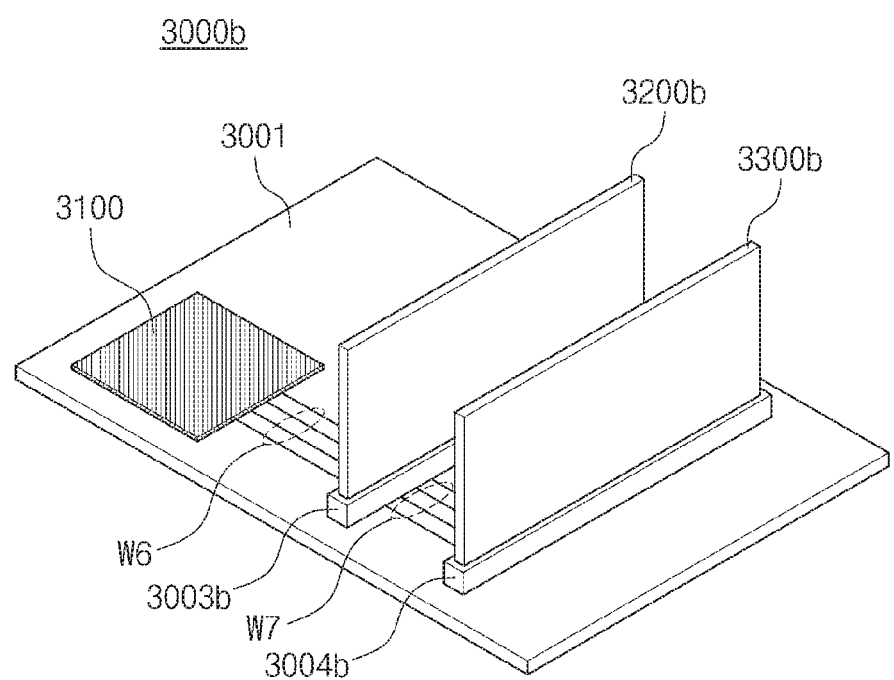
Figure 2D:
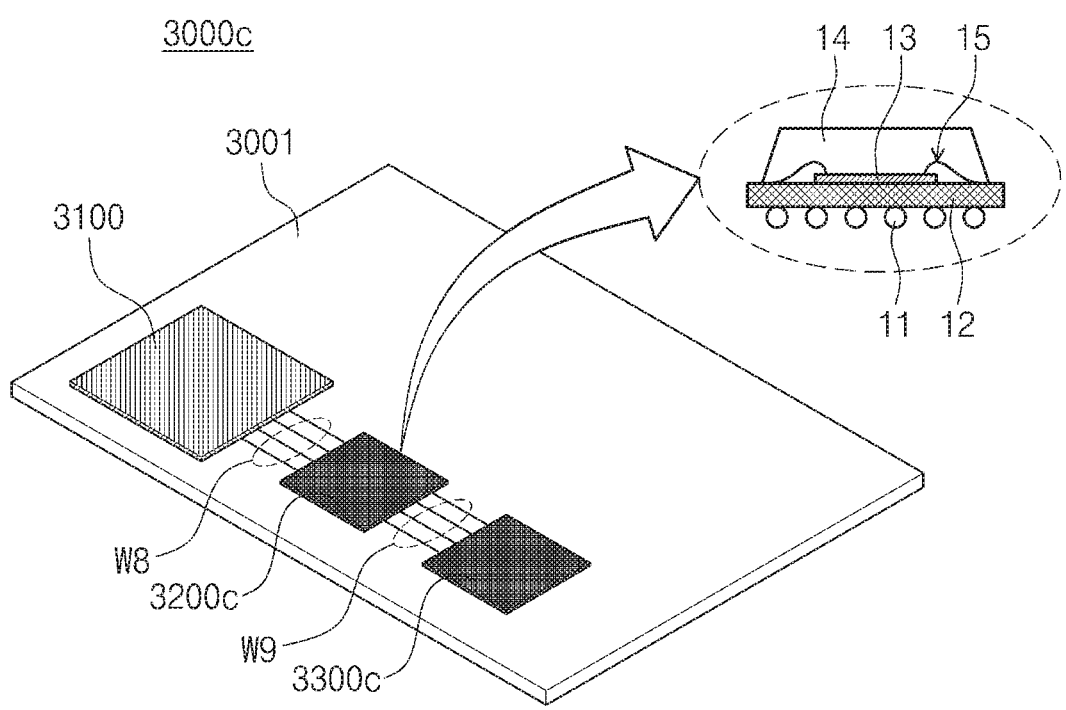

Referring to FIGS. 2B through 2D, the storage system 1000 of FIG. 1 may be embodied in a computing system (3000*a*, 3000*b*, or 3000*c*) (e.g., a desktop computer, a laptop computer, a workstation, a server system, etc.). The computing system 3000*a* of FIG. 2B may include a CPU (central processing unit) 3100 and storage devices (3200*a*, 3300*a*). The CPU 3100 may be mounted on a mainboard 3001.

Each of the storage devices (3200*a*, 3300*a*) may be a hard disk drive (HDD) or a solid state drive (SSD). The first storage device 3200*a* may be connected to a connector 3003*a* on the mainboard 3001. The first storage device 3200*a* may be connected to directly communicate with the CPU 3100 through a conductive pattern W3 and a wire cable W4. The second storage device 3300*a* may be connected to directly communicate with the first storage device 3200*a* through a wire cable W5. According to at least some example embodiments of the inventive concepts, wire cable W4 and wire cable W5 may each include one or more signal lines. The second storage device 3300*a* may not be directly connected to the CPU 3100.

A computing system 3000*b* of FIG. 2C may include the CPU 3100 and storage devices (3200*b*, 3300*b*). Each of the storage devices (3200*b*, 3300*b*) may be a memory module or a SSD embodied by a card module. The first storage device 3200*b* may be connected to a connector 3003*b* on the mainboard 3001 and may be connected to directly communicate with the CPU 3100 through a conductive pattern W6. The second storage device 3300*b* may be connected to a connector 3004*b* on the mainboard 3001 and may be connected to directly communicate with the first storage device 3200*b* through a conductive pattern W7. The second storage device 3300*b* may not be directly connected to the CPU 3100.

A computing system 3000*c* of FIG. 2D may include the CPU 3100 and storage devices (3200*c*, 3300*c*). Each of the storage devices (3200*c*, 3300*c*) may be an on-board SSD or a BGA (ball grid array) SSD embodied in the form of a chip or a chip package. The first storage device 3200*c* may be connected to directly communicate with the CPU 3100 through a conductive pattern W8 and may be connected to directly communicate with the second storage device 3300c through a conductive pattern W9. The second storage device 3300c may not be directly connected to the CPU 3100.

In the case where the first storage device 3200c is a BGA SSD, the first storage device 3200c may include a nonvolatile memory and a controller chip 13 mounted on the mainboard 3001. The nonvolatile memory and the controller chip 13 may be connected to the conductive patterns (W8, W9) through a bonding wire 15 and may be covered with a mold compound 14. Although in FIG. 2D, it is illustrated that the nonvolatile memory and the controller chip 13 are mounted on the mainboard 3001 through a wire bonding, a flip-chip method may be used. The first storage device 3200c may be mounted on the mainboard 3001 through solder balls 11.

In FIGS. 2A through 2D, each of the application processor 2100 and the CPU 3100 may correspond to the host 1100 of FIG. 1. The embedded storage device 2200 and each of the first storage devices (3200a, 3200b, 3200c) may correspond to the first storage device 1200 of FIG. 1. The removal storage device 2300 and each of the second storage devices (3300a, 3300b, 3300c) may correspond to the second storage device 1300 of FIG. 1.

Figure 3:
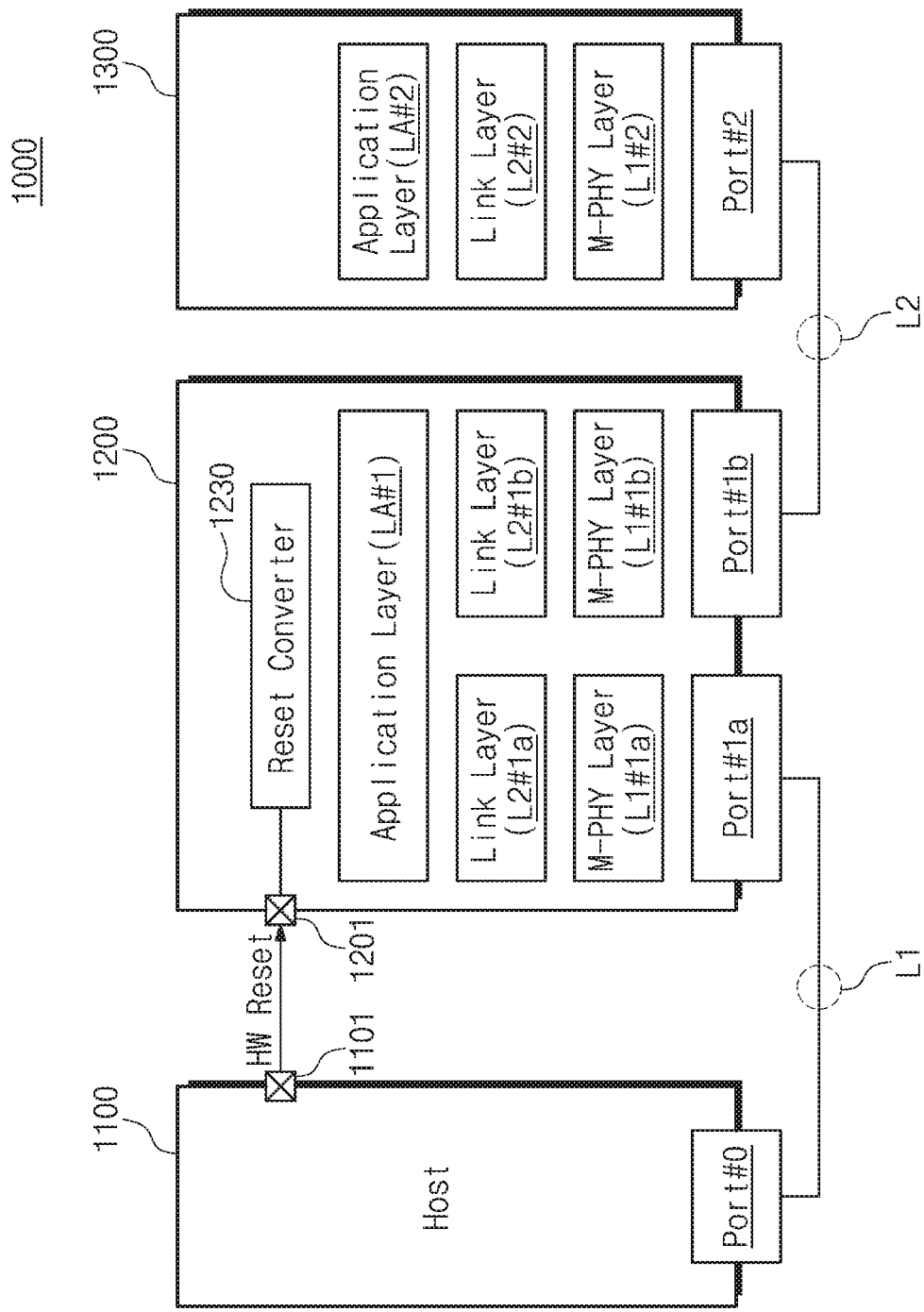
FIG. 3 is a block diagram illustrating a layer structure according to an interface protocol that can be adopted in a storage system of FIG. 1.

FIG. 3 is a block diagram illustrating a layer structure according to an interface protocol that can be adopted in a storage system 1000 of FIG. 1. The host 1100 and the storage devices 1200 and 1300 may be embodied according to a UFS protocol suggested by MIPI® Alliance (e.g., the JEDEC Universal Flash Storage (UFS) standard, version 2.1 (JESD220C), or another UFS standard).

Although not illustrated in the drawing, the host 1100 may include a M-PHY® layer, a link layer, and an application/HCI (host controller interface) layer (hereinafter, referred to as an application layer). The link layer may include a PHY adaptor layer, a data link layer, a network layer, and a transmission layer. According to at least some example embodiments of the inventive concepts, the term "transmission layer," as used herein, is synonymous with the term "transport layer." Each layers of the host 1100 may include a program code executed by a circuit and/or a processor core to perform its own function.

The first storage device 1200 may include M-PHY® layers (L1#1a, L1#1b), link layers (L2#1a, L2#1b), and an application/UTP (UFS transport protocol) layer LA#1 (hereinafter it is referred to as an application layer). The layers (L1#1a, L1#1b, L2#1a, L2#1b, LA#1) of the first storage device 1200 may be included in the controller 1220 of FIG. 1. Each of the layers (L1#1a, L1#1b, L2#1a, L2#1b, LA#1) of the first storage device 1200 may include a program code executed by a circuit and/or a processor core to perform its own function.

The second storage device 1300 may include a M-PHY® layer L1#2, a link layer L2#2, and an application/UTP layer LA#2 (hereinafter, referred to as an application layer). The layers (L1#2, L2#2, LA#2) of the second storage device 1300 may be included in the controller 1320 of FIG. 1. Each of the layers (L1#2, L2#2, LA#2) of the second storage device 1300 may include a program code executed by a hardware circuit and/or a processor core to perform its own function.

Each of the M-PHY® layers (L1#1a, L1#1b, L1#2) may include a communication circuit (e.g., a transmitter/receiver, a modulator/demodulator, an encoder/decoder, an oscillator, etc.) to transmit and receive a packet. A M-PHY® layer (not illustrated) of the host 1100 may exchange a packet with (i.e., receive a packet from and/or send a packet to) the M-PHY® layer L1#1a of the first storage device 1200 through a line L1 that connects ports (Port#0, Port#1a). The M-PHY® layer L1#1b of the first storage device 1200 may exchange a packet with (i.e., receive a packet from and/or send a packet to) the M-PHY® layer L1#2 of the second storage device 1300 through a line L2 that connects ports (Port#1b, Port#2). For example, each of the M-PHY® layers (L1#1a, L1#1b, L1#2) is a physical layer and may be embodied according to a M-PHY® protocol suggested by the MIPI® Alliance (e.g., the MIPI® Alliance specification for M-PHY® v3.0 or another M-PHY® specification).

Although not illustrated in the drawing, each of the M-PHY®link layers (L2#1a, L2#1b, L2#2) may include a PHY adaptor layer, a data link layer, a network layer, and a transmission layer.

The PHY adaptor layers can manage communication environments of the M-PHY® layers (L1#1a, L1#1b, L1#2), respectively. For example, the PHY adaptor layers may process a data symbol or may control power for the M-PHY® layers (L1#1a, L1#1b, L1#2) respectively. Each of the data link layers can manage a physical transmission and composition of data. Each of the network layers can manage a communication path or handle communication timing. Each of the transmission layers can detect a data error and recover the error.

Thus, the PHY adaptor layers, the data link layers, the network layers, and the transmission layers can transmit and convert a packet transmitted and received through the M-PHY® layers (L1#1a, L1#1b, L1#2). For example, the PHY adaptor layers, the data link layers, the network layers, and the transmission layers are included in the link layer and may be embodied according to a Unified Protocol (UniPro$^{SM}$) protocol stack suggested by the MIPI® Alliance (e.g., the MIPI® Alliance UniPro$^{SM}$ v1.6 specification or another UniPro$^{SM}$ specification).

The application layer of the host 1100 and the application layers (LA#1, LA#2) may provide a communication service on the host 1100 and the storage devices 1200 and 1300 based on a packet transmitted through the link layer. The application layers (LA#1, LA#2) are a high-order layer and can handle a request from a user of the host 1100 and the storage devices 1200 and 1300. The M-PHY® layers (L1#1a, L1#1b, L1#2) and the link layers (L2#1a, L2#1b, L2#2) are a low-order layer and may perform a communication with an external device for the application layers (LA#1, LA#2).

Communications between the layers may be based on packets having different data formats. According to an interface protocol suggested by the MIPI® Alliance, an application layer (not illustrated) of the host 1100 and each of the application layers (LA#1, LA#2) can exchange packets having a UFS protocol information unit (UPIU) format with one another and process the packet. For example, each of the PHY adaptor layers can exchange a data format including a PHY adaptor control protocol (PACP) frame with one another and process the packet. Since the UPIU format and the PACP frame may be well understood by one of ordinary skill, a detail description will be omitted.

Figure 4:
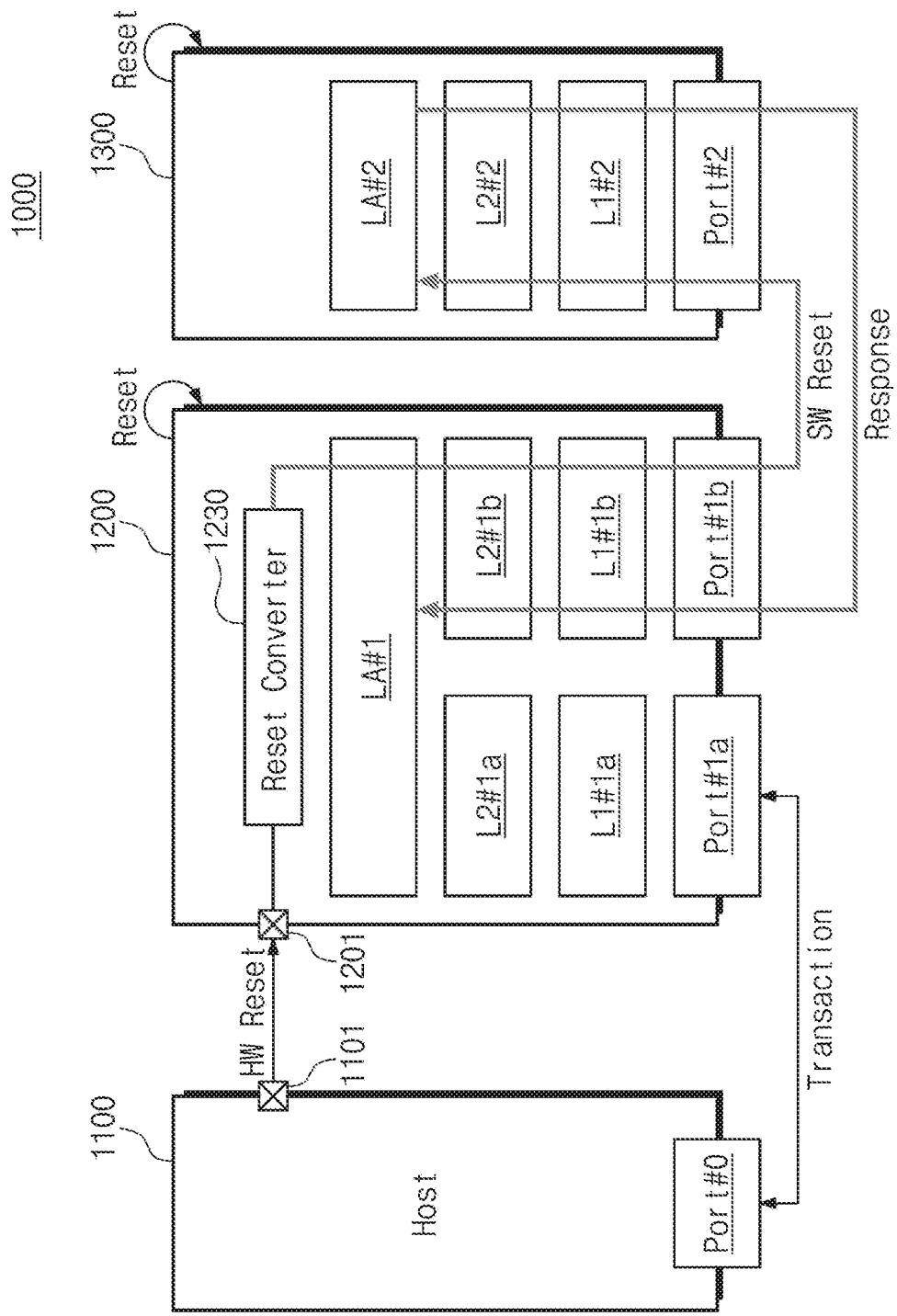
FIG. 4 is a block diagram illustrating a process for performing a reset with respect to storage devices in a storage system according to at least some example embodiments of the inventive concepts.
Figure 5:
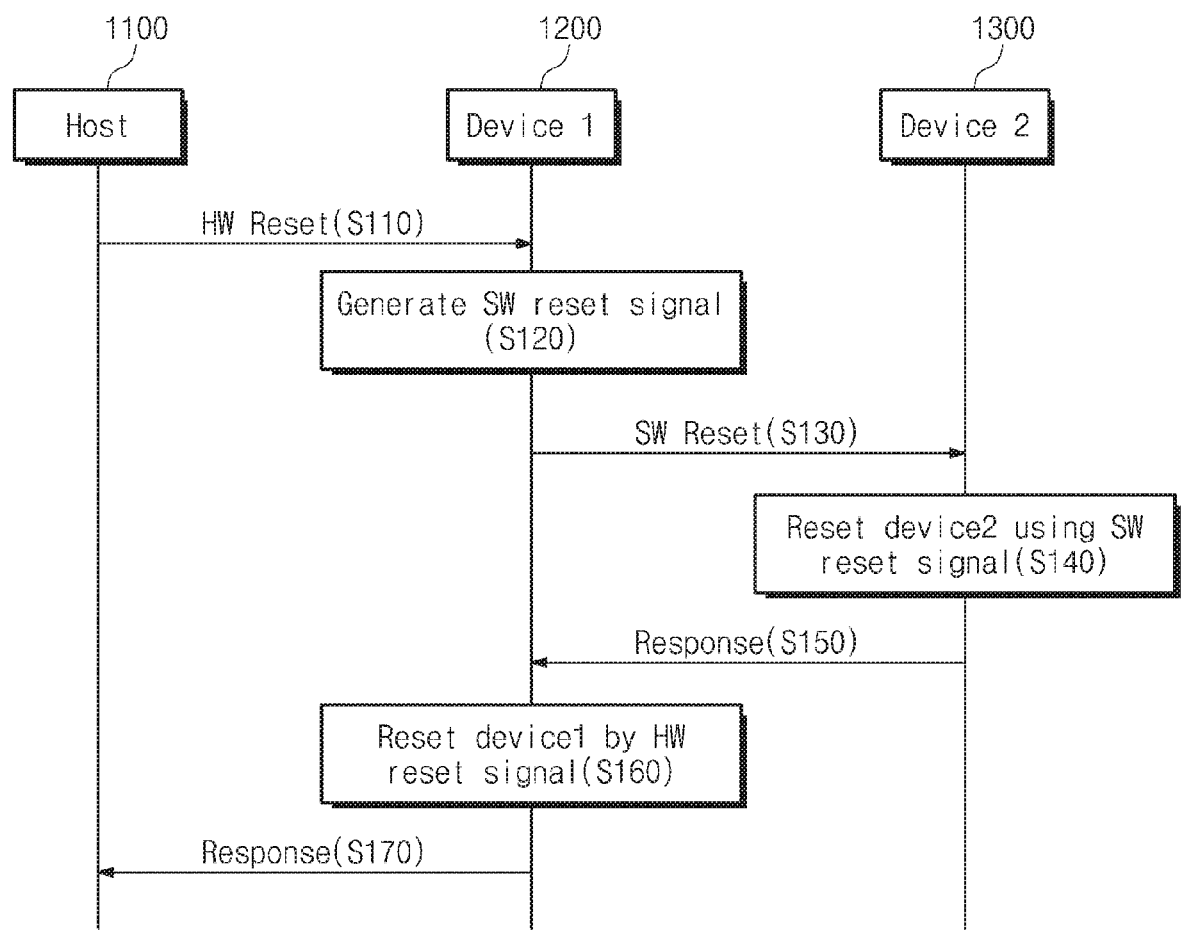
FIGS. 5 and 6 are flowcharts illustrating a reset operation in a storage system of FIG. 4.
Figure 6:
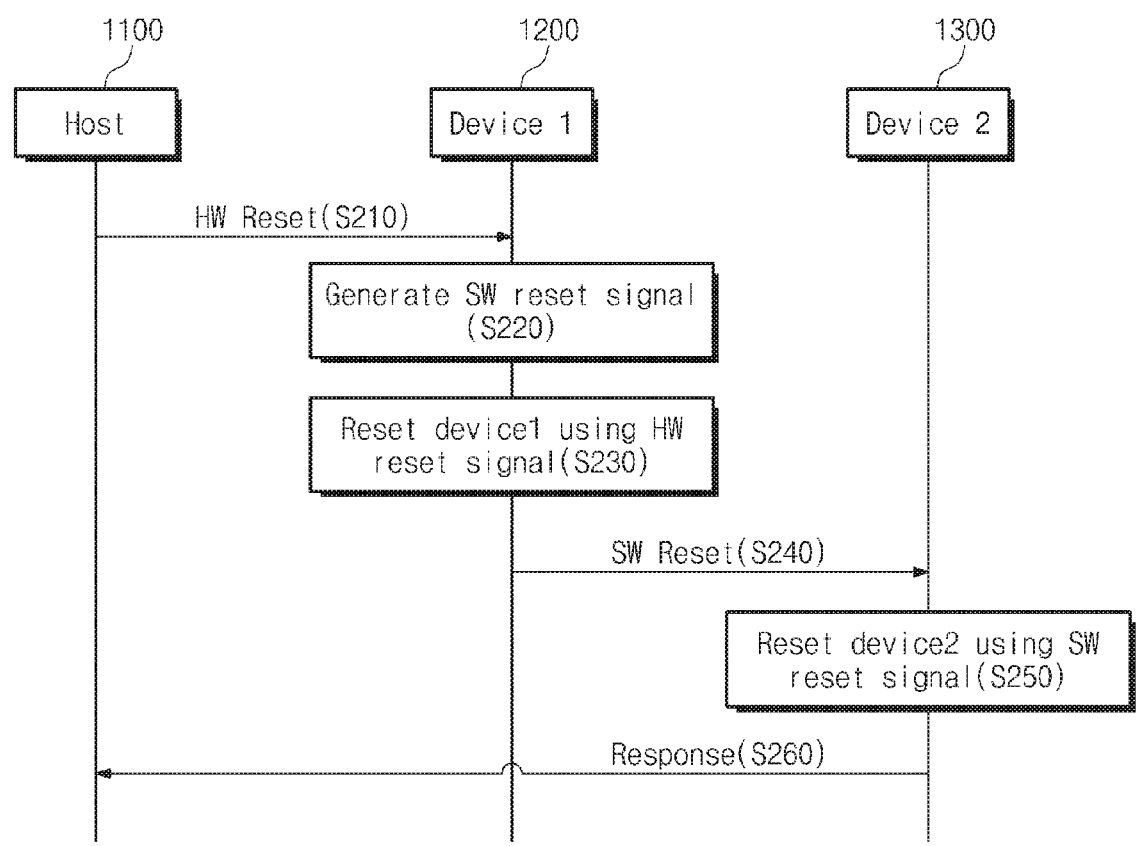

FIG. 4 is a block diagram illustrating a process for performing a reset with respect to storage devices 1200 and 1300 in a storage system 1000 according to at least some example embodiments of the inventive concepts. FIGS. 5 and 6 are flowcharts illustrating a reset operation in a storage system 1000 of FIG. 4. To help understanding of the description, a reset operation with respect to the storage devices 1200 and 1300 is described with reference to FIGS. 4 and 5.

In an operation S110, the host 1100 may transmit a hardware reset signal (HW Reset) to the first storage device 1200. The hardware reset signal (HW Reset) may be received through a separate line that connects the reset pins 1101 and 1201 included in the host 1100 and the first storage device 1200 respectively. The hardware reset signal (HW Reset) may be transmitted to the reset converter 1230.

The hardware reset signal (HW Reset) is basically to reset the first storage device 1200 connected through the reset pins 1101 and 1201. In the case of resetting even the second storage device 1300, an identifier (e.g., ID, address, tag, etc.) that can identify the second storage device 1300 may be transmitted to the first storage device 1200 together with the hardware reset signal (HW Reset). The identifier may be transmitted to the first storage device 1200 together with the hardware reset signal (HW Reset) or may be transmitted to the first storage device 1200 through a line that connects the ports (Port#0, Port#1a) independently of the hardware reset signal (HW Reset).

Thus, according to at least some example embodiments of the inventive concepts, an identifier for identifying a storage device to be additionally identified may be transmitted to the first storage device 1200. However, at least some example embodiments of the inventive concepts are not limited to the example shown in FIG. 4. For example, the identifier may be transmitted to the first storage device 1200 through various routes or methods other than, or in addition to, those discussed above with respect to FIGS. 4 and 5.

In an operation S120, the reset converter 1230 may generate a software reset signal (SW Reset) in response to the hardware reset signal (HW Reset). The software reset signal (SW Reset) may include information (e.g., the identifier described in the operation S110) that can identify the second storage device 1300 that it wants to reset.

Even though the hardware reset signal (HW Reset) is received from the host 1100, a reset with respect to the first storage device 1300 may not be executed. That is, the first storage device 1200 may be reset after it is confirmed that the second storage device 1300 is reset by the software reset signal (SW Reset). The application layer LA#1, when a response representing (i.e., indicating) that the second storage device 1300 is reset is received, may execute a reset operation with respect to the first storage device 1200 using the hardware reset signal (HW Reset). However, at least some example embodiments of the inventive concepts are not limited thereto and the reset operation may be managed by the reset converter 1230 in other embodiments.

In an operation S130, the software reset signal (SW Reset) may be transmitted to the second storage device 1300. Unlike the case where the hardware reset signal (HW Reset) is transmitted to the first storage device 1200 through the line that connects the reset pins 1101 and 1201, a separate line for transmitting a reset signal between the first storage device 1200 and the second storage device 1300 does not exist. That is, the second storage device 1300 may not include a separate reset pin for receiving the hardware reset signal (HW Reset) such as that illustrated in the first storage device 1200. For example, the software reset signal (SW Reset) may be transmitted through a line that connects the ports (Port#1b, Port#2) through which a communication is performed between the first storage device 1200 and the second storage device 1300. The software reset signal (SW Reset) may be transmitted to the application layer LA#2 through the link layer L2#1b, the M-PHY® layers (L1#1b, L1#2), and the link layer L2#2.

In an operation S140, the second storage device 1300 may be reset by the software reset signal (SW Reset). The software reset signal (SW Reset) may be a kind of command generated based on the hardware reset signal (HW Reset). Thus, the software reset signal (SW Reset) may be checked and processed by the application layer LA#2. The application layer LA#2 may process the software reset signal (SW Reset) to reset constituent elements (e.g., the layers (L1#2, L2#2, LA#2), the port (Port#2), and the nonvolatile memory 1310) of the second storage device 1300. Setting values of the layers (L1#2, L2#2, LA#2), the port (Port#2), and the nonvolatile memory 1310) of the second storage device 1300 may be initialized by a reset by the software reset signal (SW Reset).

In an operation S150, a response representing (i.e., indicating) that the second storage device 1300 is reset may be transmitted to the first storage device 1200. The response may include not only information about that a reset with respect to the second storage device 1300 is executed but also information about whether a reset with respect to the second storage device 1300 succeeds. The response may be transmitted to the application layer LA#1 through the link layer L2#2, the M-PHY® layers (L1#1b, L1#2), and the link layer L2#1b.

In an operation S160, the first storage device 1200 may be reset. The first storage device 1200 may be reset by the hardware reset signal (HW Reset) received from the host 1100. Setting values of constituent elements (e.g., the layers (L1#1a, L1#1b, L2#1a, L2#1b, LA#1), the ports (Port#1a, Port#1b), and the nonvolatile memory 1210) of the first storage device 1200 may be initialized by the hardware reset signal (HW Reset). A scheme where, when the hardware reset signal (HW Reset) is received from the host 1100, the first storage device 1200 is not reset until after the response is received from the second storage device 1300, may be managed in general by the application layer LA#1.

In the case where the response from the second storage device 1300 includes information about whether a reset with respect to the second storage device 1300 succeeds, a reset operation with respect to the second storage device 1300 may be additionally executed. Like in the case where a test operation with respect to the second storage device 1300 is executed, in the case where the second storage device 1300 has to be successfully reset, a reset operation with respect to the second storage device 1300 may be additionally executed. For example, when the response from the second storage device 1300 indicates that a reset operation with respect to the second storage device 1300 fails, the first storage device 1200 may transmit the software reset signal (SW Reset) to the second storage device 1300 again. That is, the operations S130 to S150 may be repeated until a reset operation with respect to the second storage device 1300 succeeds.

In an operation S170, a response representing (i.e., indicating) that the first storage device 1200 is reset may be transmitted to the host 1100. The response may be transmitted to the host 1100 through the link layer L2#1a, the M-PHY® layers L1#1a, and the ports (Port#1a, Port#0).

When through the response, the host 1100 recognizes that the storage devices 1200 and 1300 are reset, subsequent operations may be executed. For example, a test operation with respect to the storage devices 1200 and 1300 is executed or a communication/transaction between the host 1100 and the first storage device 1200 and a communication/transaction between the host 1100 and the second storage device 1300 may be performed.

According to at least some other example embodiments of the inventive concepts, a reset with respect to the storage devices 1200 and 1300 may be performed in a different manner from that described in FIG. 5. An example reset operation different from the example reset operation above with respect to FIG. 5 is illustrated in FIG. 6. Since the example reset operation illustrated in FIG. 5 and the example reset operation illustrated in FIG. 6 differ in terms of order but have the similar basic operations, a somewhat shorter description of the example reset operation illustrated in FIG. 6 is provided below. A reset operation with respect to the storage devices 1200 and 1300 is described with reference to FIGS. 4 and 6 below.

In an operation S210, the host 1100 may transmit the hardware reset signal (HW Reset) to the first storage device 1200. The hardware reset signal (HW Reset) may be transmitted through a separate line that connects the reset pins 1101 and 1201 different from a communication line (e.g., L1 of FIG. 3) between the host 1100 and the first storage device 1200.

In an operation 5220, the reset converter 1230 may generate the software reset signal (SW Reset) in response to the hardware reset signal (HW Reset). The software reset signal (SW Reset) may include information (e.g., the identifier described in S110 of FIG. 5) that can identify the second storage device 1300 that it wants to reset.

In an operation S230, the first storage device 1200 may be reset. The first storage device 1200 may be reset by the hardware reset signal (HW Reset) received from the host 1100. Setting values of the layers (L1#1a, L1#1b, L2#1a, L2#1b, LA#1), the ports (Port#1a, Port#1b), and the nonvolatile memory 1210) may be initialized by the hardware reset signal (HW Reset).

In an operation S240, the software reset signal (SW Reset) may be transmitted to the second storage device 1300.

Even though it was described that the reset converter 1230 generates the software reset signal (SW Reset) after the first storage device 1200 is reset, the software reset signal (SW Reset) may be generated before the first storage device 1200 is reset. The application layer LA1 may reset the first storage device 1200 after transmitting the software reset signal (SW Reset) to the second storage device 1300.

In an operation S250, the second storage device 1300 may be reset by the software reset signal (SW Reset). Setting values of the layers (L1#2, L2#2, LA#2), the port (Port#2), and the nonvolatile memory 1310 may be initialized by the reset by the software reset signal (SW Reset).

In an operation S260, a response representing (i.e., indicating) that the second storage device 1300 is reset may be transmitted to the host 1100 or the first storage device 1200.

In the case where the response from the second storage device 1300 includes information indicates that a reset with respect to the second storage device 1300 is executed, the response may be transmitted to the host 1100. In this case, the response may be transmitted to an application layer (not shown) of the host 1100 through the layers (L2#2, L1#2) of the second storage device 1300 and the layers (L1#1b, L2#1b, L2#1a, L1#1a) of the first storage device 1200. After that, subsequent operations such as a test with respect to the storage devices 1200 and 1300 or an entry into a normal mode may be executed.

In the case where the response from the second storage device 1300 includes information about whether a reset with respect to the second storage device 1300 succeeds, two cases may occur. In the case where the second storage device 1300 is successfully reset, the response may be transmitted to the host 1100 and the subsequent operations described above may be executed. In the case where the reset with respect to the second storage device 1300 fails, the response may be transmitted to the first storage device 1200. In this case, the operations S240 and S250 may be repeated until the second storage device 1300 is successfully reset.

According to the embodiments described through FIGS. 4 through 6, the first storage device 1200 that can directly receive the hardware reset signal (HW Reset) from the host 1100 may be directly reset by the hardware reset signal (HW Reset). However, the second storage device 1300 indirectly connected to the host 1100 through the first storage device 1200 cannot directly receive the hardware reset signal (HW Reset). Thus, the second storage device 1300 may be reset by the software reset signal (SW Reset) generated by the reset converter 1230 included in the first storage device 1200. Accordingly, the host 1100 and the storage devices 1200 and 1300 are serially connected to one another and thereby a problem that cannot reset the second storage device 1300 which is not directly connected to the host 1100 may be solved.

In the embodiments described in FIGS. 4 through 6, it was described that all of the storage devices 1200 and 1300 are reset. However, in other embodiments, the first storage device 1200 may not be reset and only the second storage device 1300 may be reset by the software reset signal (SW Reset) generated in response to the hardware reset signal (HW Reset). Since this is similar to the embodiments described through FIGS. 5 and 6 except that a reset with respect to the first storage device 1200 is omitted, a detail description thereof is omitted.

Figure 7A:
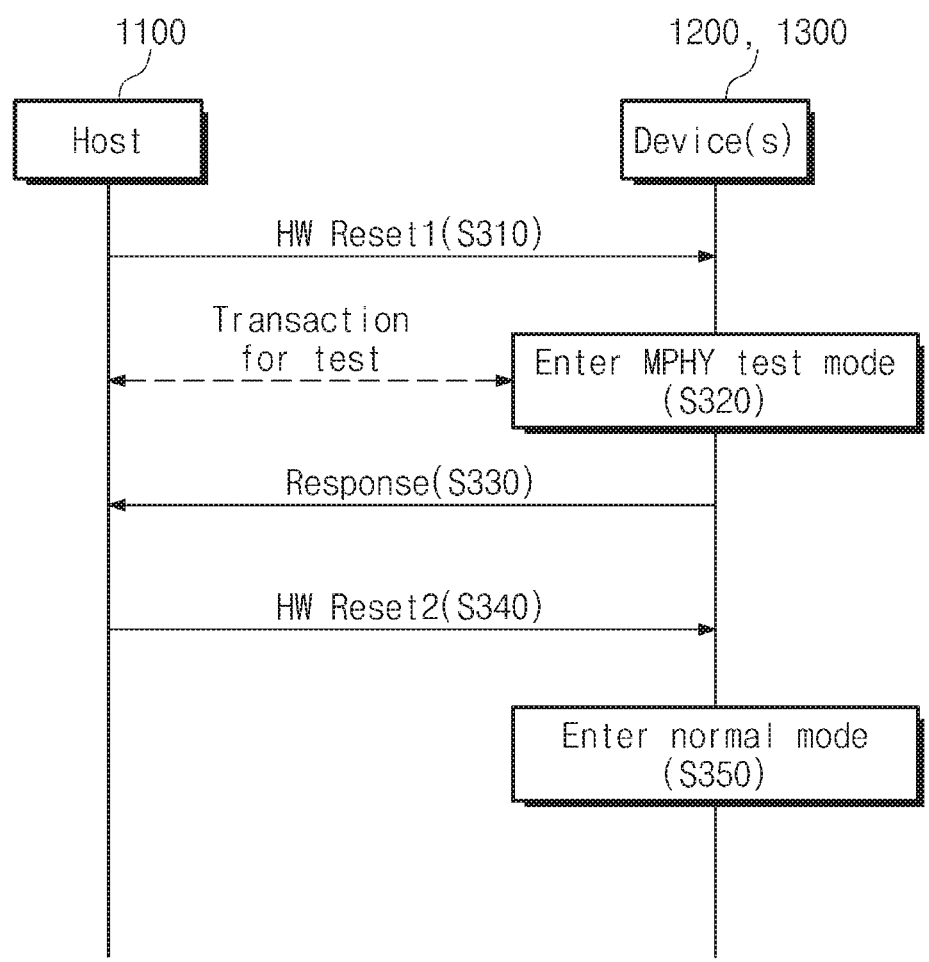
FIG. 7A is a flowchart illustrating an operation of a storage system according to at least some example embodiments of the inventive concepts.

FIG. 7A is a flowchart illustrating an operation of a storage system 100 according to at least some example embodiments of the inventive concepts. Using the reset method described through FIGS. 4 through 6, a method of putting the storage devices 1200 and 1300 into a test mode or a normal mode may be described. To help understanding of description, it will be described with reference to FIG. 7A together with FIGS. 4 through 6.

In an operation S310, the host 1100 may transmit a first hardware reset signal (HW Reset 1) to the storage devices 1200 and 1300. Only the first storage device 1200 including a reset pin for receiving the first hardware reset signal (HW Reset1) may receive the first hardware reset signal (HW Reset1).

In an operation S320, the storage devices 1200 and 1300 may enter a MPHY test mode. The first storage device 1200 may be reset by the first hardware reset signal (HW Reset1) and may enter a test mode by a command from the host 1100. The second storage device 1300 may be reset a software reset signal generated by the first storage device 1200 and may enter the test mode by the command from the host 1100. In the test mode, a test operation may be executed by a data transaction between the host 1100 and the storage devices 1200 and 1300.

In an operation S330, the storage devices 1200 and 1300 may transmit a response to the host 1100. The response may be a signal representing (i.e., indicating) that a test operation with respect to the storage devices 1200 and 1300 is successfully completed.

In an operation S340, the host 1100 may transmit a second hardware reset signal (HW Reset2) to the storage devices. Only the first storage device 1200 including a reset pin for receiving the second hardware reset signal (HW Reset2) may receive the second hardware reset signal (HW Reset2).

In an operation S350, the storage devices 1200 and 1300 may enter a normal mode. The first storage device 1200 can enter the normal mode by being reset by the second hardware reset signal (HW Reset2). The second storage device 1300 can enter the normal mode by being reset by the software reset signal generated by the first storage device 1200.

Figure 7B:
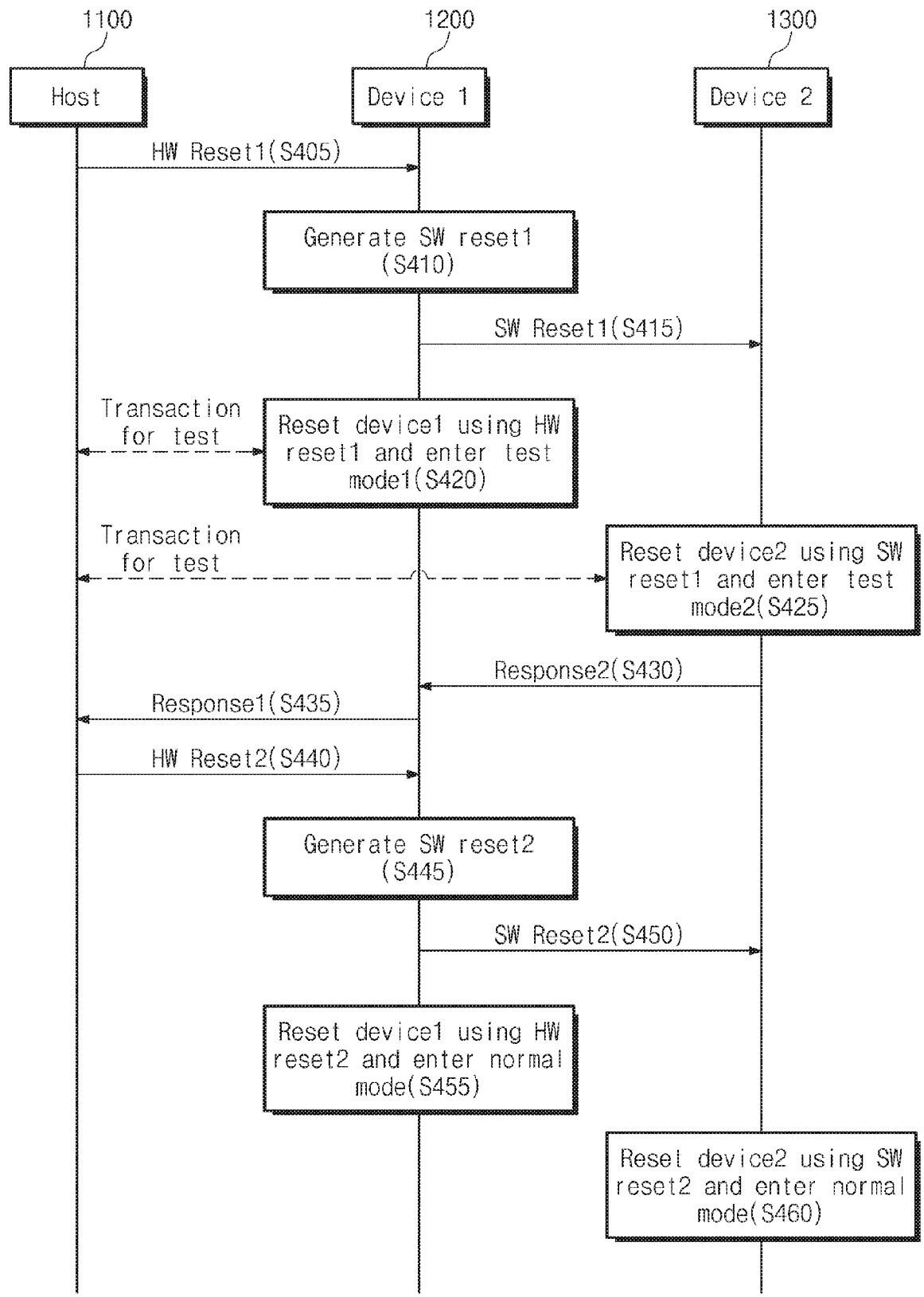
FIG. 7B is a flowchart illustrating an embodiment illustrated in FIG. 7A in more detail.

FIG. 7B is a flowchart illustrating an embodiment illustrated in FIG. 7A in more detail. To help understanding of description, it will be described with reference to FIG. 7B together with FIGS. 4 through 6.

In an operation S405, the host 1100 may transmit the first hardware reset signal (HW Reset1) to the first storage device 1200. In an embodiment where the host 1100 and the storage devices 1200 and 1300 are connected to one another in a cascade connection structure, since only the first storage device 1200 has a hardware reset pin, only the first storage device 1200 may receive the first hardware reset signal (HW Reset1).

In an operation S410, the first storage device 1200 may receive a first software reset signal (SW Reset1). The first software reset signal (SW Reset1) may be generated by the reset converter 1230 of the first storage device 1200.

In an operation S415, the first storage device 1200 may transmit the first software reset signal (SW Reset1) to the second storage device 1300. Since the second storage device 1300 does not have a separate pin for receiving a reset signal, the first software reset signal (SW Reset1) may be transmitted through a line that connects the ports (Port#1b, Port#2).

In an operation S420, the first storage device 1200 may be reset by the first hardware reset signal (HW Reset1) and may enter a first test mode by a command from the host 1100. Various test operations with respect to the first storage device 1200 may be executed in the first test mode by a data transaction between the host 1100 and the first storage device 1200.

In an operation S425, the second storage device 1300 may be reset by the first software reset signal (SW Reset1) and may enter a second test mode by a command from the host 1100. Various test operations with respect to the second storage device 1300 may be executed in the second test mode by a data transaction between the host 1100 and the second storage device 1300. The data transaction between the host 1100 and the second storage device 1300 may be performed through a line that connects the ports (Port#0, Port#1a) and a line that connects the ports (Port#1b, Port#2).

In an operation S430, the second storage device 1300 may transmit a second response (Response2) to the first storage device 1200. In an operation S435, the first storage device 1200 may transmit a first response (Response1) to the host 1100. The second response (Response2) may be a signal representing (i.e., indicating) that a test operation with respect to the second storage device 1300 is completed and the first response (Response1) may be a signal representing (i.e., indicating) that a test operation with respect to the first storage device 1200 is completed.

In an operation S440, the host 1100 may transmit the second hardware reset signal (HW Reset2) to the first storage device 1200.

In an operation S445, the first storage device 1200 may generate a second software reset signal (SW Reset2) in response to the second hardware reset signal (HW Reset2).

In an operation S450, the first storage device 1200 may transmit the second software reset signal (SW Reset2) to the second storage device 1300.

In an operation S455, the first storage device 1200 may be reset by the second hardware reset signal (HW Reset2) and may enter the normal mode. In the normal mode, a transaction between the host 1100 and the first storage device 1200 may be performed through a line that connects the ports (Port#0, Port#1a).

In an operation S460, the second storage device 1300 may be reset by the second software reset signal (SW Reset2) and may enter the normal mode. In the normal mode, a transaction between the host 1100 and the second storage device 1300 may be performed through a line that connects the ports (Port#0, Port#1a) and a line that connects the ports (Port#1b, Port#2).

Even though it is illustrated that the second response (Response2) is transmitted to the first storage device 1200, the second response (Response2) may be transmitted to the host 1100 depending on an embodiment. In this case, the host 1100 may transmit the second hardware reset signal (HW Reset2) to the first storage device 1200 after the responses (Response1, Response2) are all received.

Even though it was described that after the first storage device 1200 transmits the software reset signals (SW Reset1, SW Reset2) to the second storage device 1300, the first storage device 1200 is reset, the first storage device 1200 may be reset before the first storage device 1200 transmits the software reset signals (SW Reset 1, SW Reset2) to the second storage device 1300. The first storage device 1200 may be reset after the second storage device 1300 is reset. This modified embodiment is based on FIGS. 5 and 6 and these execution orders may be variously modified according to at least some example embodiments of the inventive concepts.

Figure 8:
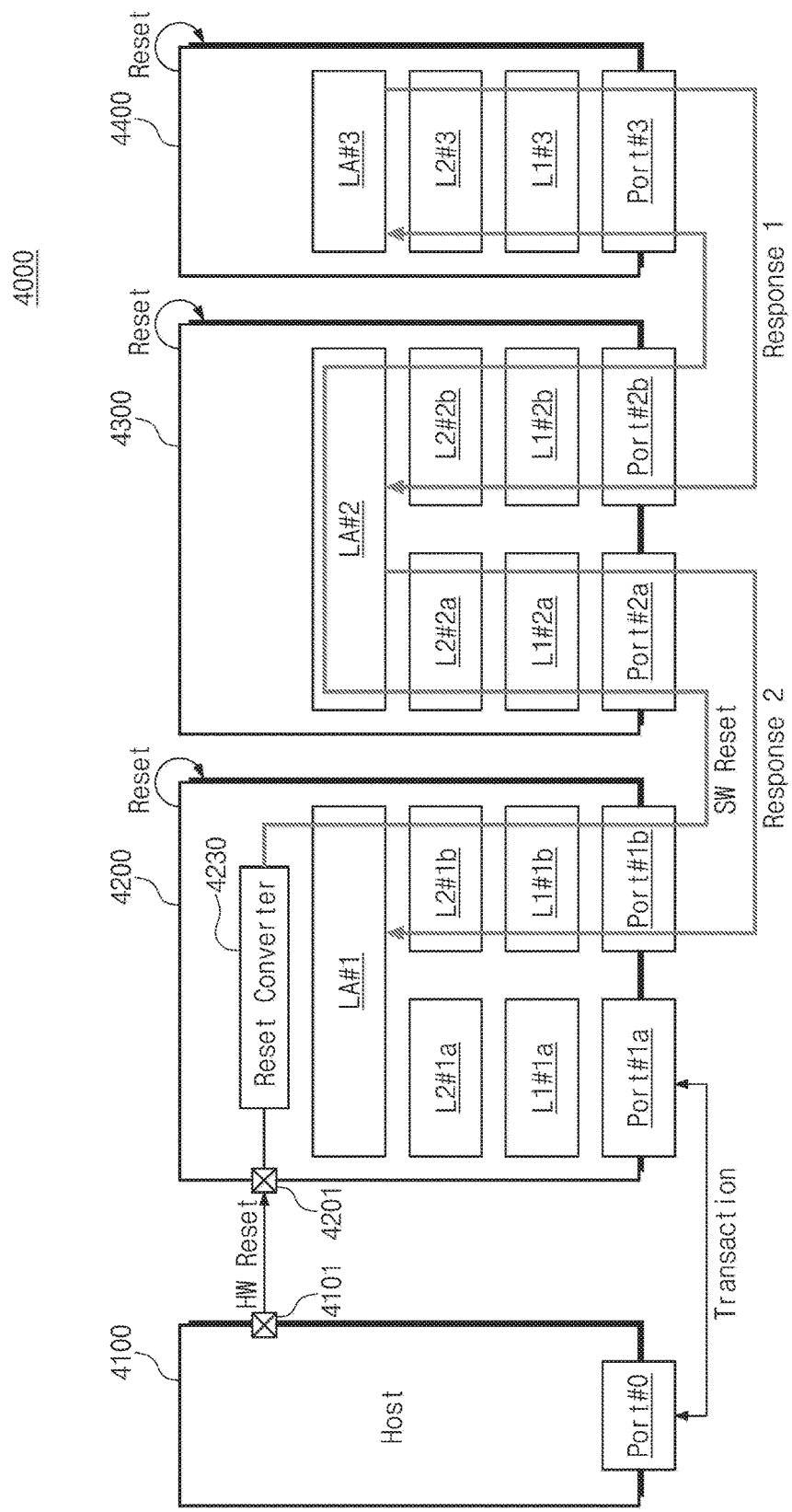
FIG. 8 is a block diagram illustrating a process for performing a reset with respect to storage devices in a storage system according to at least some example embodiments of the inventive concepts.
Figure 9:
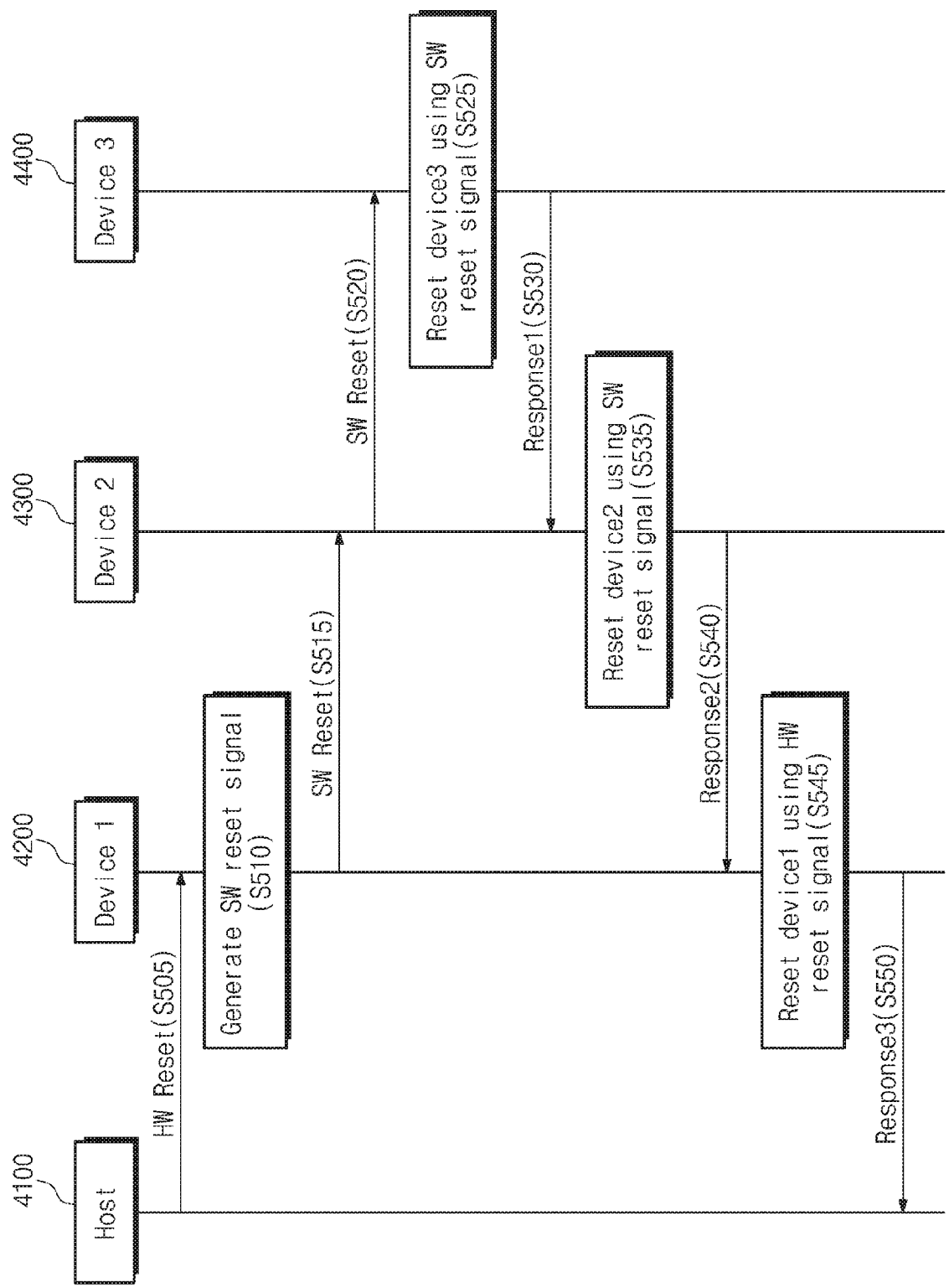
FIGS. 9 and 10 are flowcharts illustrating a reset operation in a storage system of FIG. 8.
Figure 10:
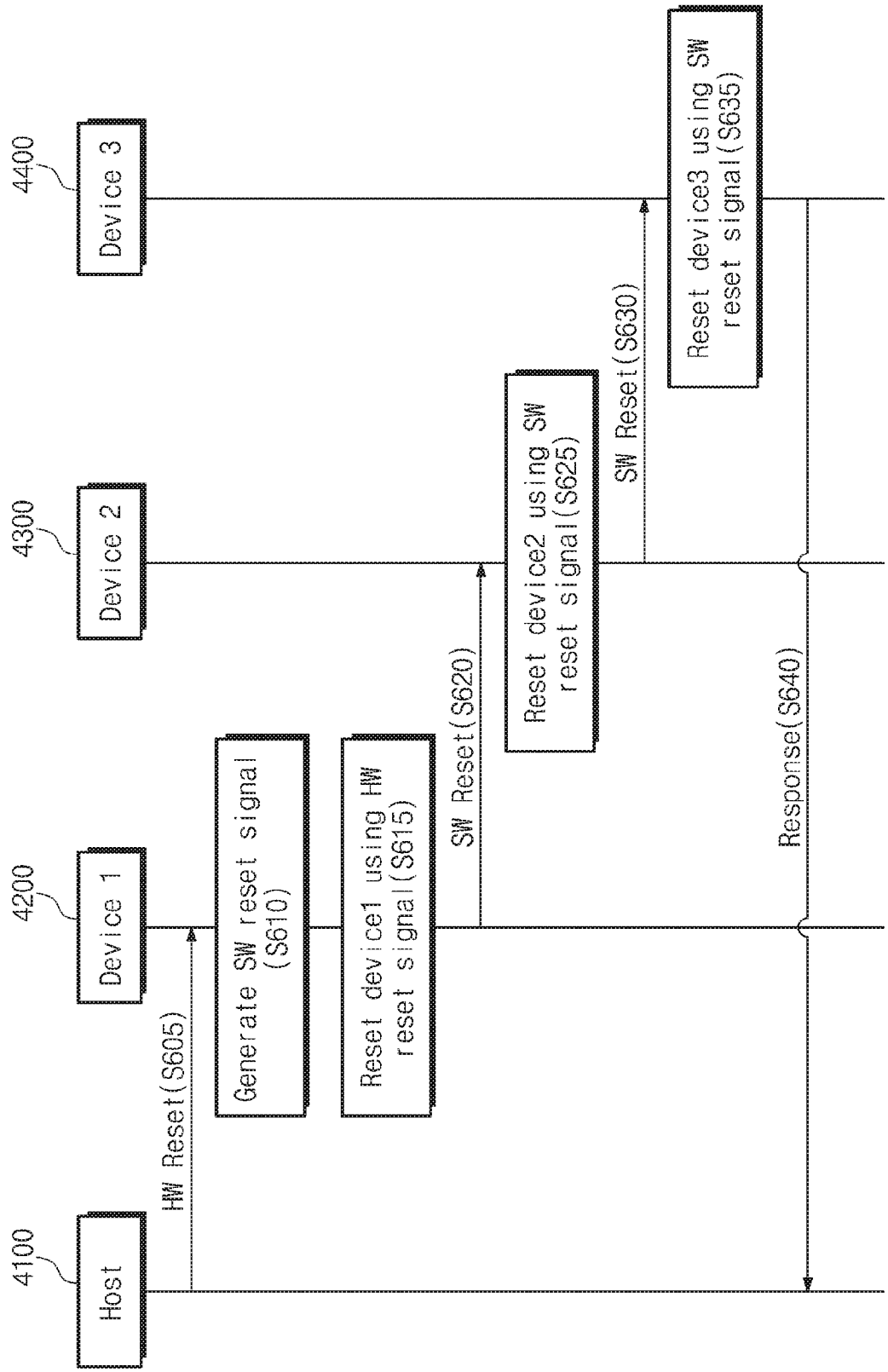

FIG. 8 is a block diagram illustrating a process for performing a reset with respect to storage devices (4200, 4300, 4400) in a storage system 4000 according to at least some example embodiments of the inventive concepts. FIGS. 9 and 10 are flowcharts illustrating a reset operation in a storage system 4000 of FIG. 8. The storage system 4000 may further include a third storage device 4400 that is indirectly connected to a host 4100 through the storage devices 4200 and 4300. To help understanding of description, a reset operation with respect to the storage devices (4200, 4300, 4400) is described with reference to FIGS. 8 and 9.

In an operation S505, the host 4100 may transmit a hardware reset signal (HW Reset) to the first storage device 4200. The hardware reset signal (HW Reset) may be received through a separate line that connects reset pins (4101, 4201) included in the host 4100 and the first storage device 4200 respectively.

An identifier (e.g., ID, an address, a tag, etc.) that can identify a storage device (e.g., storage devices (4300, 4400)) to be additionally reset may be transmitted to the first storage device 4200 together with the hardware reset signal (HW Reset). The identifier may be transmitted to the first storage device 4200 together with the hardware reset signal (HW Reset) or may be transmitted to the first storage device 4200 through a line that connects separate ports (Port#0, Port#1a) independently of the hardware reset signal (HW Reset).

In an operation S510, a reset converter 4230 may generate a software reset signal (SW Reset) in response to the hardware reset signal (HW Reset). The software reset signal (SW Reset) may include information (e.g., the identifier described above) that can identify the storage devices (4300, 4400) that it wants to reset. According to at least some example embodiments of the inventive concepts, the reset converter 4230 may be implemented by hardware (e.g., a circuit or circuitry in the first storage device 4200), software (e.g., a microprocessor or controller of the first storage device 4200 executing program code), or a combination of hardware and software.

Although the hardware reset signal (HW Reset) is received from the host 4100, a reset with respect to the first storage device 4200 may not be executed. That is, the first storage device 4200 may be reset after checking that the storage devices (4300, 4400) are reset by the software reset signal (SW Reset). For example, when a signal (Response) representing (i.e., indicating) that the second storage device 4300 is reset is received, an application layer LA#1 may execute a reset operation with respect to the first storage device 4200 using the hardware reset signal (HW Reset).

In an operation S515, the software reset signal (SW Reset) may be transmitted to the second storage device 4300. In an operation S520, the software reset signal (SW Reset) may be transmitted to the third storage device 4400. The second storage device 4300 and the third storage device 4400 may not include a separate reset pin for receiving the hardware reset signal (HW Reset). The second storage device 4300 may receive the software reset signal (SW Reset) through a line that connects the port (Port#1*b*) of the first storage device 4200 and the port (Port#2*a*) of the second storage device 4300. The third storage device 4400 may receive the software reset signal (SW Reset) through a line that connects the port (Port#2*b*) of the second storage device 4300 and the port (Port#3) of the third storage device 4400. The software reset signal (SW Reset) may be transmitted to the application layer (LA#3) through layers (L2#1*b*, L1#1*b*, L2#2*a*, L2#2*b*, L1#2*b*, L1#3, L2#3).

In the case of resetting the storage devices (4300, 4400) by the software reset signal (SW Reset), the software reset signal (SW Reset) may not simply bypass an application layer (LA#2). The application layer (LA#2) may be configured to execute a reset with respect to the second storage device 4300 after the third storage device 4400 is reset. To conceptually represent this, it is illustrated that the software reset signal (SW Reset) passes through the application layer (LA#2).

In an operation S525, the third storage device 4400 may be reset by the software reset signal (SW Reset). The software reset signal (SW Reset) may be a kind of command generated based on the hardware reset signal (HW Reset). Thus, the software reset signal (SW Reset) may be checked and processed by the application layer LA#3. Setting values of the layers (L1#3, L2#3, LA#3), the port (Port#3), and a nonvolatile memory (not shown) of the second storage device 1300 may be initialized by processing, by the application layer (LA#3), the software reset signal (SW Reset).

In an operation S530, a signal (Response1) representing (i.e., indicating) that the third storage device 4400 is reset may be transmitted to the second storage device 4300. The Response1 may include not only information that a reset with respect to the third storage device 4400 is executed but also information about whether the reset with respect to the third storage device 4400 succeeds. The Response1 may be transmitted to the application layer (LA#2) through the link layer (L2#3), the M-PHY® layers (L1#3, L1#2*b*), and the link layer (L2#2*b*).

In the case where the Response1 from the third storage device 4400 includes information about whether the reset with respect to the third storage device 4400 succeeds, if the third storage device 4400 is not successfully reset, the operations S520, S525 and S530 may be repeated until the third storage device 4400 is successfully reset.

In an operation S535, the second storage device 4300 may be reset by the software reset signal (SW Reset). Since the software reset signal (SW Reset) is a kind of command that processes a reset using software, it may be checked and processed by the application layer (LA#2). Setting values of the layers (L1#2*a*, L1#2*b*, L2#2*a*, L2#2*b*, LA#2), the ports (Port#2*a*, Port#2*b*), and a nonvolatile memory (not shown) may be initialized by processing, by the application layer (LA#2), the software reset signal (SW Reset).

In an operation S540, a signal (Response2) representing (i.e., indicating) that the second storage device 4300 is reset may be transmitted to the first storage device 4200. The Response2 may include not only information that a reset with respect to the second storage device 4300 is executed but also information about whether the reset with respect to the second storage device 4300 succeeds. The Response2 may be transmitted to the application layer (LA#1) through the link layer (L2#2*a*), the M-PHY® layers (L1#2*a*, L1#1*b*), and the link layer (L2#1*b*).

In the case where the Response2 from the second storage device 4300 includes information about whether the reset with respect to the second storage device 4300 succeeds, if the second storage device 4300 is not successfully reset, the operations S515, S535 and S540 may be repeated until the second storage device 4300 is successfully reset.

In an operation S545, the first storage device 4200 may be reset. The first storage device 4200 may be reset by the hardware reset signal (HW Reset) received from the host 4100. The constituent elements (e.g., the layers (L1#1*a*, L1#1*b*, L2#1*a*, L2#2*b*, LA#1), the ports (Port#1*a*, Port#1*b*) and a nonvolatile memory (not shown)) of the first storage device 4200 may be initialized by the hardware reset signal (HW Reset). A scheme where as soon as the hardware reset signal (HW Reset) is received from the host 4100, the first storage device 4200 is not reset and when the Response2 is received from the second storage device 4300, the first storage device 4200 is reset may be managed in general by the application layer LA#1.

In an operation S550, a signal (Response3) representing (i.e., indicating) that the first storage device 4200 is reset may be transmitted to the host 4100. The Response3 may be transmitted to the host 4100 through the link layer (L2#1*a*), the M-PHY® layer (L1#1*a*), and the ports (Port#1*a*, Port#0). For brevity of illustration, the Response3 from the first storage device 4200 is not illustrated in FIG. 8.

When through the response (Response3), the host 4100 recognizes that the storage devices (4200, 4300, 4400) are reset, subsequent operations may be executed. For example, a test operation with respect to the storage devices (4200, 4300, 4400) may be executed or a communication/transaction between the host 4100 and the storage devices (4200, 4300, 4400) may be performed.

In other embodiments, a reset with respect to the storage devices (4200, 4300, 4400) may be performed in a different manner from that described in FIG. 9. An embodiment different from the embodiment of FIG. 9 is illustrated in FIG. 10. Since the embodiment of FIG. 9 and the embodiment of FIG. 10 have a difference in the order of operations but have the similar basic overall operation, a somewhat shorter description of the example reset operation illustrated in FIG. 10 is provided below. A reset operation with respect to the storage devices (4200, 4300, 4400) is described with reference to FIGS. 8 and 10.

In an operation S605, the host 4100 may transmit the hardware reset signal (HW Reset) to the first storage device 4200. An identifier that can identify a storage device (e.g., storage devices (4300, 4400)) to be additionally reset may also be transmitted to the first storage device 4200 together with hardware reset signal (HW Reset).

In an operation S610, the reset converter 4230 may generate the software reset signal (SW Reset) in response to the hardware reset signal (HW Reset). The software reset signal (SW Reset) may include information (e.g., the identifier described above) that can identify the storage devices (4300, 4400) that it wants to reset.

In an operation S615, the first storage device 4200 may be reset. The first storage device 4200 may be reset by the hardware reset signal (HW Reset) received from the host 4100. Setting values of constituent elements (e.g., the layers (L1#1a, L1#1b, L2#1a, L2#1b, LA#1), the ports (Port#1a, Port#1b), and a nonvolatile memory (not shown)) of the first storage device 4200 may be initialized by the hardware reset signal (HW Reset).

In an operation S620, the software reset signal (SW Reset) may be transmitted to the second storage device 4300.

In an operation S625, the second storage device 4300 may be reset by the software reset signal (SW Reset). Setting values of the layers (L1#2a, L1#2b, L2#2a, L2#2b, LA#2), the ports (Port#2a, Port#2b), and a nonvolatile memory (not shown) may be initialized by processing, by the application layer (LA#2), the software reset signal (SW Reset).

In an operation S630, the software reset signal (SW Reset) may be transmitted to the third storage device 4400.

In an operation S635, the third storage device 4300 may be reset by the software reset signal (SW Reset). Setting values of the layers (L1#3, L2#3, LA#3), the port (Port#3), and a nonvolatile memory (not shown) may be initialized by processing, by the application layer (LA#3), the software reset signal (SW Reset).

In an operation S640, a signal (Response) representing (i.e., indicating) that the third storage device 4400 is reset may be transmitted to the host 4100. The Response from the third storage device 4400 may be transmitted to the host 4100 through the link layer (L2#3), the M-PHY® layers (L1#3, L1#2b), the link layers (L2#1b, L2#1a), and the M-PHY® layer (L1#1a). For brevity of illustration, the Response from the third storage device 4400 is not illustrated in FIG. 8. The Response is different from the Response1 and the Response2.

If the Response from the third storage device 4400 is received to the host 4100 and thereby a reset with respect to the storage devices (4200, 4300, 4400) is completed, subsequent operations such as a test operation or an entry into a normal mode may be executed.

Figure 11:
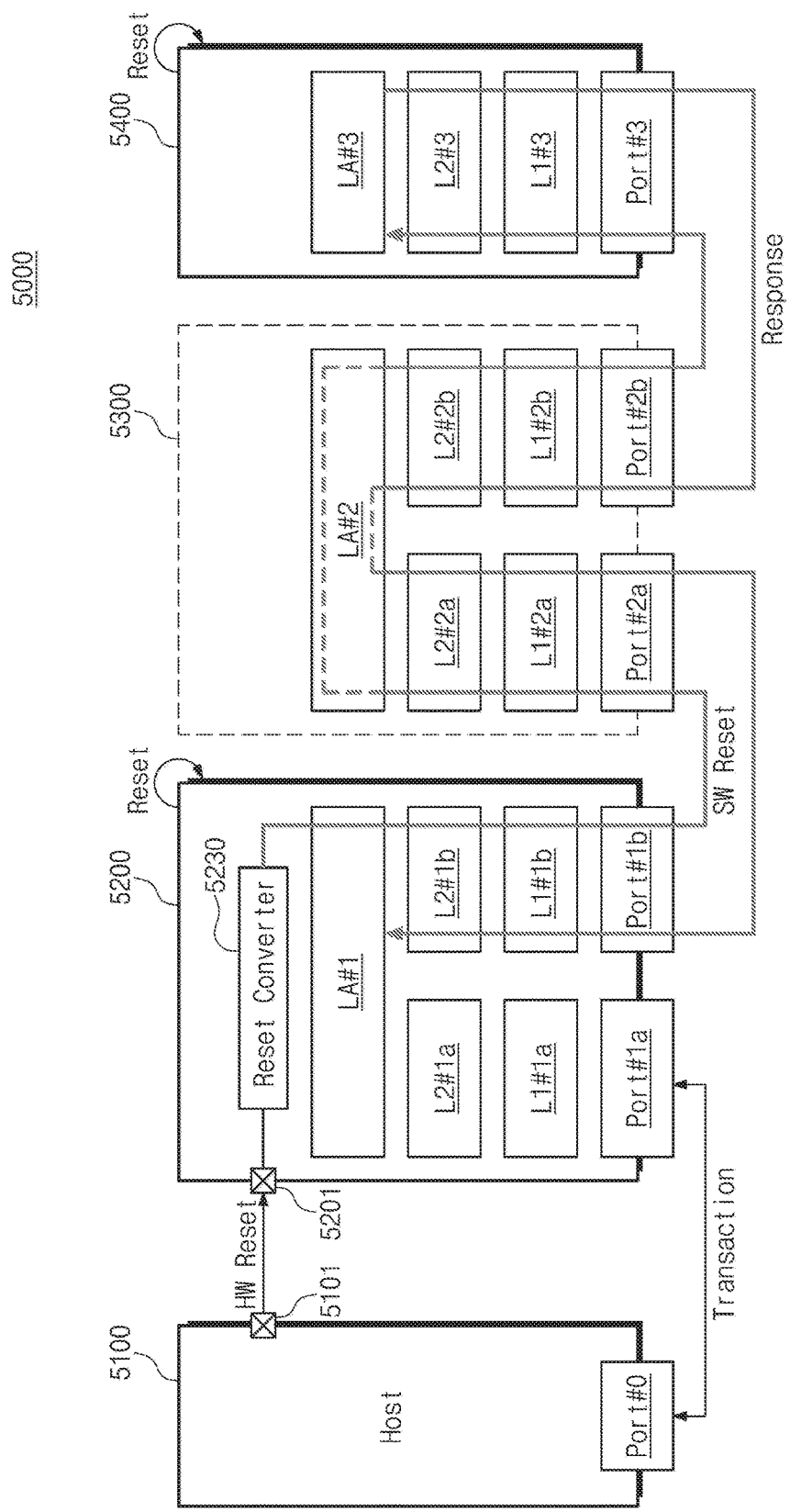
FIG. 11 is a block diagram illustrating a process for performing a reset with respect to storage devices in a storage system according to at least some example embodiments of the inventive concepts.
Figure 12:
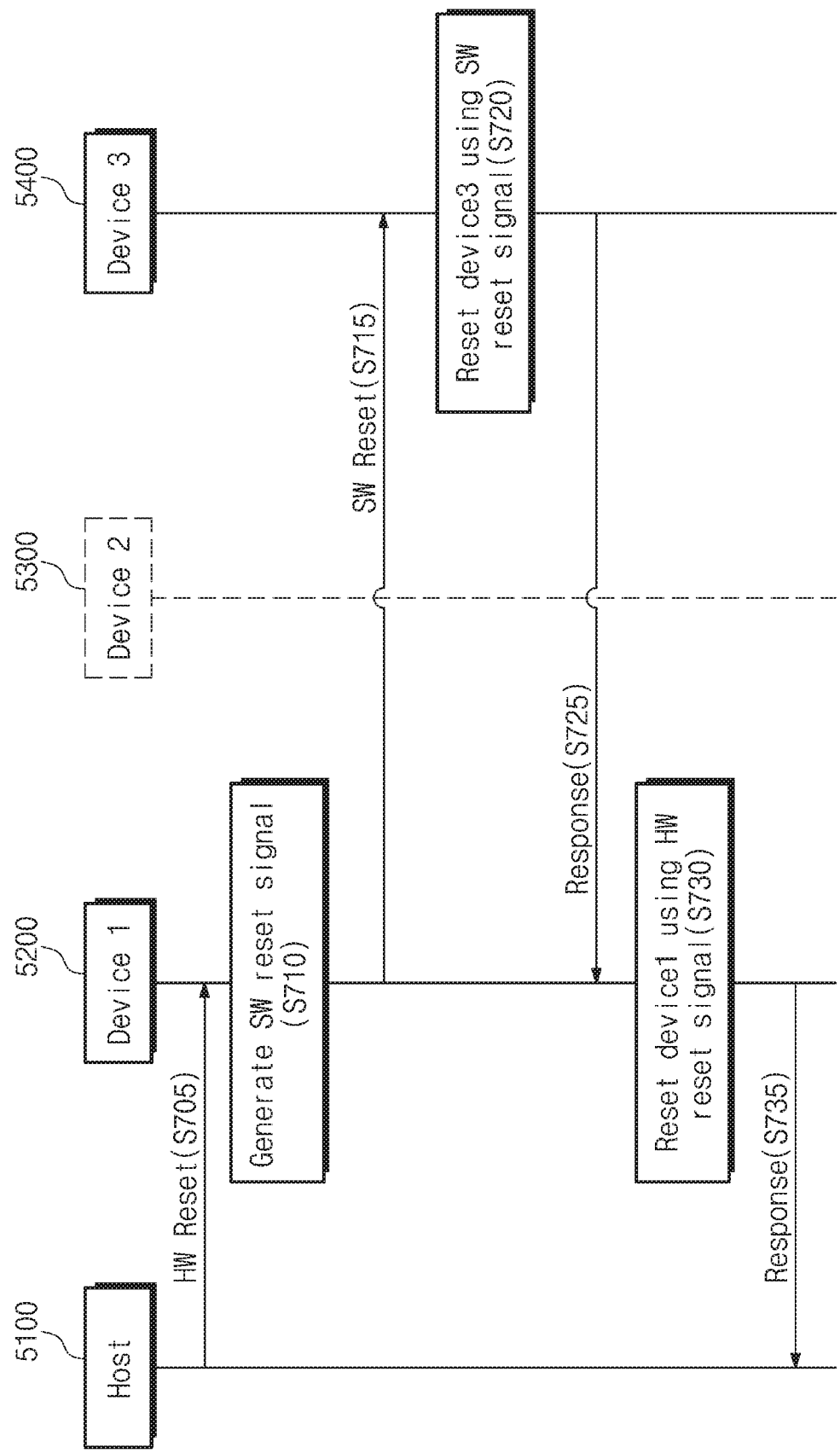
FIGS. 12 and 13 are flowcharts illustrating a reset operation in a storage system of FIG. 11.
Figure 13:
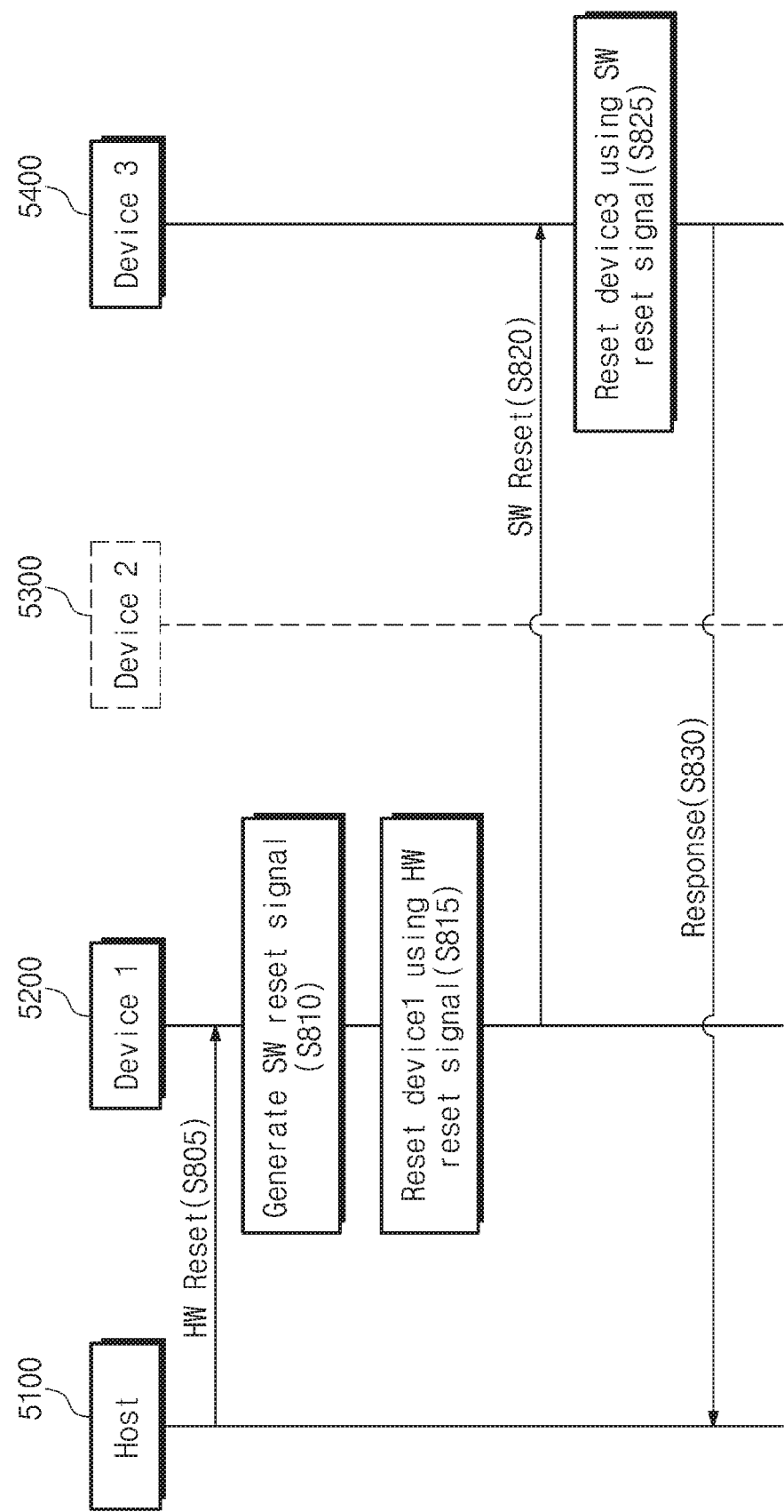

FIG. 11 is a block diagram illustrating a process for performing a reset with respect to storage devices (5200, 5300, 5400) in a storage system 5000 according to at least some example embodiments of the inventive concepts. FIGS. 12 and 13 are flowcharts illustrating a reset operation in a storage system 5000 of FIG. 11. The present embodiment is similar to the embodiment of FIG. 8 except that a reset with respect to the second storage device 5300 is omitted. Thus, overlapping description is omitted. A reset operation with respect to the storage devices (5200, 5300) is described with reference to FIGS. 11 and 12.

In an operation S705, a host 5100 may transmit a hardware reset signal (HW Reset) to the first storage device 5200. The hardware reset signal (HW Reset) may be received through a separate line that connects reset pins 5101 and 5201 included in the host 5100 and the first storage device 5200 respectively.

In the present embodiments, the second storage device 5300 is not reset. Thus, an identifier (e.g., ID, address, tag, etc.) that can identify the third storage device 5400 to be additionally reset may also be transmitted to the first storage device 5200 together with the hardware reset signal (HW Reset). The identifier may be transmitted together with the hardware reset signal (HW Reset) or may be transmitted to the first storage device 5200 through a line that connects separate ports (Port#0, Port#1a) independently of the hardware reset signal (HW Reset).

In an operation S710, a reset converter 5230 may generate a software reset signal (SW Reset) in response to the hardware reset signal (HW Reset). The software reset signal (SW Reset) may include an identifier that can identify the third storage device 5400 that it wants to reset. According to at least some example embodiments of the inventive concepts, the reset converter 5230 may be implemented by hardware (e.g., a circuit or circuitry in the first storage device 5200), software (e.g., a microprocessor or controller of the first storage device 5200 executing program code), or a combination of hardware and software.

Even though the hardware reset signal (HW Reset) is received from the host 5100, a reset with respect to the first storage device 5200 may not be executed. The first storage device 5200 may be reset after it is checked that the third storage device 5400 is reset by the software reset signal (SW Reset). When a signal (Response) representing (i.e., indicating) that the third storage device 5400 is reset is received, an application layer (LA#1) may execute a reset operation with respect to the first storage device 5200 using the hardware reset signal (HW Reset).

In an operation S715, the software reset signal (SW Reset) may be transmitted to the third storage device 5400. The software reset signal (SW Reset) may be transmitted to an application layer (LA#3) through a link layer (L2#1b), M-PHY® layers (L1#1b, L1#2a), link layers (L2#2a, L2#2b), PHY layers (L1#2b, L1#3), and a link layer (L2#3). The second storage device 5300 and the third storage device 5400 may not include a separate reset pin for receiving the hardware reset signal (HW Reset). The third storage device 5400 may receive the software reset signal (SW Reset) through a line that connects a port (Port#1b) of the first storage device 5200 and a port (Port#2a) of the second storage device 5300 and a line that connects a port (Port#2b) of the second storage device 5300 and a port (Port#3) of the third storage device 5400.

In the case where the second storage device 5300 is not reset, an application layer (LA#2) may not actually process the software reset signal (SW Reset). That is, the software reset signal (SW Reset) may simply bypass the application layer (LA#2). To conceptually represent this, a portion where the software reset signal (SW Reset) passes through the application layer (LA#2) is illustrated by a dotted arrow.

In an operation S720, the third storage device 5400 may be reset by the software reset signal (SW Reset). The software reset signal (SW Reset) may be a kind of command generated based on the hardware reset signal (HW Reset). Setting values of the layers (L1#3, L2#3, LA#3), the port (Port#3), and a nonvolatile memory (not shown) may be initialized by processing, by the application layer (LA#3), the software reset signal (SW Reset).

In an operation S725, a signal (Response) representing (i.e., indicating) that the third storage device 5400 is reset may be transmitted to the first storage device 5200. The Response may include not only information that a reset with respect to the third storage device 5400 is executed but also information about whether the reset with respect to the third storage device 5400 succeeds. The Response from the third storage device 5400 may be transmitted to the application layer (LA#2) through the link layer (L2#3), the M-PHY® layers (L1#3, L1#2b), the link layers (L2#2b, L2#2a), the M-PHY® layers (L1#2a, L1#1b), and the link layer (L2#1b).

In the case where the Response from the third storage device 5400 includes information about whether the reset with respect to the third storage device 5400 succeeds, if the third storage device 5400 is not successfully reset, the operations S715, S720 and S725 may be repeated until the third storage device 5400 is successfully reset.

In an operation S730, the first storage device 5200 may be reset. The first storage device 5200 may be reset by the hardware reset signal (HW Reset) received from the host 5100. Setting values of the first storage device 5200 may be initialized by the hardware reset signal (HW Reset). A scheme where a reset with respect to the second storage device 5300 is omitted and the first storage device 5200 is reset after a reset with respect to the third storage device 5400 is completed may be managed in general by the application layer (LA#1).

In an operation S735, a signal (Response) representing (i.e., indicating) that the first storage device 5200 is reset may be transmitted to the host 5100. For brevity of illustration, the Response from the first storage device 5200 is not illustrated in FIG. 11. When through the Response from the first storage device 5200, the host 5100 recognizes that the storage devices (5200, 5400) are reset, subsequent operations such as a test operation or an entry into a normal mode may be executed.

In other embodiments, a reset with respect to the storage devices (5200, 5400) may be performed in a different manner from that described in FIG. 12. An embodiment different from the embodiment of FIG. 13 is illustrated in FIG. 12. Since the embodiment of FIG. 12 and the embodiment of FIG. 13 have a difference in the order of operations but have the similar basic operation, a somewhat shorter description of the example reset operation illustrated in FIG. 13 is provided below. A reset operation with respect to the storage devices (5200, 5400) is described with reference to FIGS. 11 and 13.

In an operation S805, the host 5100 may transmit the hardware reset signal (HW Reset) to the first storage device 5200. An identifier (e.g., ID, address, tag, etc.) that can identify the third storage device 5400 that it additionally wants to reset may also be transmitted to the first storage device 5200 together with the hardware reset signal (HW Reset).

In an operation S810, the reset converter 5230 may generate the software reset signal (SW Reset) in response to the hardware reset signal (HW Reset). The software reset signal (SW Reset) may include an identifier that can identify the third storage device 5400 that it wants to reset.

In an operation S815, the first storage device 5200 may be reset. The first storage device 5200 may be reset by the hardware reset signal (HW Reset) received from the first storage device 5200 and as a result, setting values of the first storage device 5200 may be initialized.

In an operation S820, the software reset signal (SW Reset) may be transmitted to the third storage device 5400. The software reset signal (SW Reset) may be transmitted to the application layer (LA#3) through the link layer (L2#1b), the M-PHY® layers (L1#1b, L1#2a), the link layers (L2#2a, L2#2b), the M-PHY® layers (L1#2b, L1#3), and the link layer (L2#3).

In an operation S825, the third storage device 5400 may be reset by the software reset signal (SW Reset). Setting values of the third storage device 5400 may be initialized by processing, by the application layer (LA#3), the software reset signal (SW Reset).

In an operation S830, a signal (Response) representing (i.e., indicating) that the third storage device 5400 is reset may be transmitted to the host 5100. The Response from the third storage device 5400 may be transmitted to the host 5100 through the link layer (L2#3), the M-PHY® layers (L1#3, L1#2b), the link layers (L2#2b, L2#2a), the M-PHY® layers (L1#2a, L1#1b), the link layers (L2#1b, L2#1a), and the M-PHY® layer (L1#1a). For brevity of illustration, the Response transmitted from the third storage device 5400 to the host 5100 is not illustrated in FIG. 11 and is different from the Response transmitted from the third storage device 5400 to the first storage device 5200.

If the Response from the third storage device 5400 is received to the host 5100 and thereby a reset with respect to the storage devices (5200, 5400) is completed, subsequent operations such as a test operation or an entry into a normal mode may be executed.

A process of performing a reset operation with respect to the storage devices (5200, 5400) serially connected to each other was described with reference to FIGS. 11 through 13 and an example scenario in which a reset operation with respect to the second storage device 5300 is omitted. However, even in the case where a reset operation with respect to the first storage device 5200 or the third storage device 5400 is omitted, the process of performing a reset described above with reference to FIGS. 11-13 may be applied.

Figure 14:
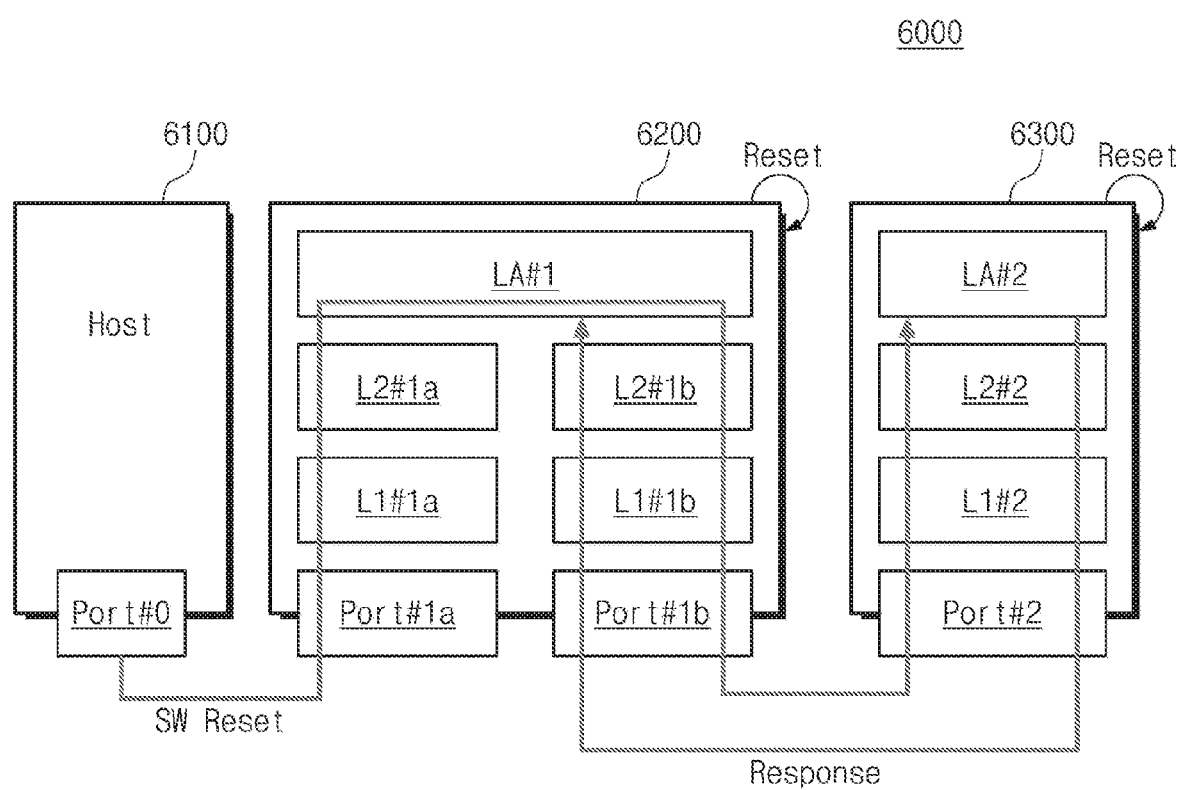
FIG. 14 is a block diagram illustrating a process for performing a reset with respect to storage devices in a storage system according to at least some example embodiments of the inventive concepts.

FIG. 14 is a block diagram illustrating a process for performing a reset with respect to storage devices (6200, 6300) in a storage system 6000 according to at least some example embodiments of the inventive concepts. The present embodiment is similar to the embodiment illustrated in FIG. 3. In the present embodiment, the first storage device 6200 may not include a reset convert for generating a software reset signal. The first storage device 6200 may not receive a hardware reset signal (HW Reset) for directly or indirectly resetting the storage devices (6200, 6300). Instead, the software reset signal (SW Reset) may be received to the first storage device 6200 through a line that connects ports (Port#0, Port#1a) used in a transaction between a host 6100 and the first storage device 6200.

The software reset signal (SW Reset) received from the host 6100 may be transmitted to the application layer (LA#1) through a M-PHY® layer (L1#1a), a link layer (L2#1a). In the case where the first storage device 6200 is reset before the second storage device 6300 is reset, the application layer (LA#1) can reset the first storage device 6200 first by processing the software reset signal (SW Reset). In the case where the second storage device 6300 is reset before the first storage device 6200 is reset, the software reset signal (SW Reset) may bypass the application layer (LA#1) to be transmitted to an application layer (LA#2).

According to at least one example embodiment of the inventive concepts, only the first storage device 6200 is reset or only the second storage device 6300 is reset, and in this case, the embodiments described through FIGS. 3 through 13 may be adaptably applied. Even in the case where three or more storage devices are connected to the host 6100, the embodiments described above may be adaptably applied. Therefore, a detail description is omitted.

Figure 15:
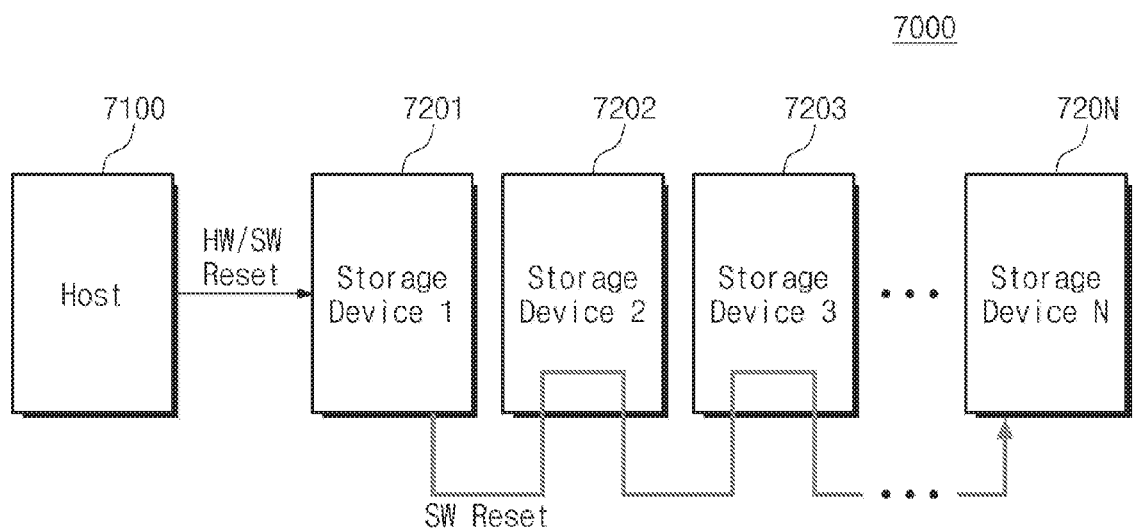
FIG. 15 is a block diagram for explaining the resetting of storage devices not directly connected to a host in a storage system according to at least some example embodiments of the inventive concepts.

FIG. 15 is a block diagram for explaining the resetting of storage devices (7202 to 720N) not directly connected to a host 7100 in a storage system 7000 according to at least some example embodiments of the inventive concepts.

The storage system 7000 may include the storage devices (7201 to 720N) serially connected to the host 7100.

The storage devices (7201 to 720N) may be serially connected to one another through respective input/output ports. The first storage device 7201 may be configured to be directly connected to the host 7100 to directly communicate with the host 7100. The second through Nth storage devices (7202 to 720N) may be serially connected to one another in a similar manner. In this manner, the plurality of storage devices (7201 to 720N) may be connected in the form of topology of a chain structure or a cascade connection structure.

When a hardware reset signal (HW Reset) is received from the host 7100 to the first storage device 7201, a reset converter (not illustrated) of the first storage device 7201 may generate a software reset signal (SW Reset). The software reset signal (SW Reset) may be a command that can reset the second through Nth storage devices (7202 to 720N). The software reset signal (SW Reset) may include an identifier that can identify a storage device that it wants to reset.

The software reset signal (SW Reset) may be sequentially transmitted to the Nth storage device 720N. After that, the storage devices may be sequentially reset from the Nth storage device 720N to the second storage device 7202 by the software reset signal (SW Reset). An application layer of each of the storage devices may recognize and process the software reset signal (SW Reset) to reset each storage device. Thereafter, the first storage device 7201 may be reset by the hardware reset signal (HW Reset).

In at least some other example embodiments of the inventive concepts, the first storage device 7201 may be reset first by the hardware reset signal (HW Reset). After that, the software reset signal (SW Reset) may be sequentially transmitted from the second storage device 7202 to the Nth storage device 720N and the storage devices may be sequentially reset from the second storage device 7202 to the Nth storage device 720N by the software reset signal (SW Reset).

The hardware reset signal (HW Reset) is not received from the host 7100 and the software reset signal (SW Reset) may be instead received from the first storage device 7201. In this case, a reset converter for generating the software reset signal (SW Reset) may not be included separately.

Figure 16:
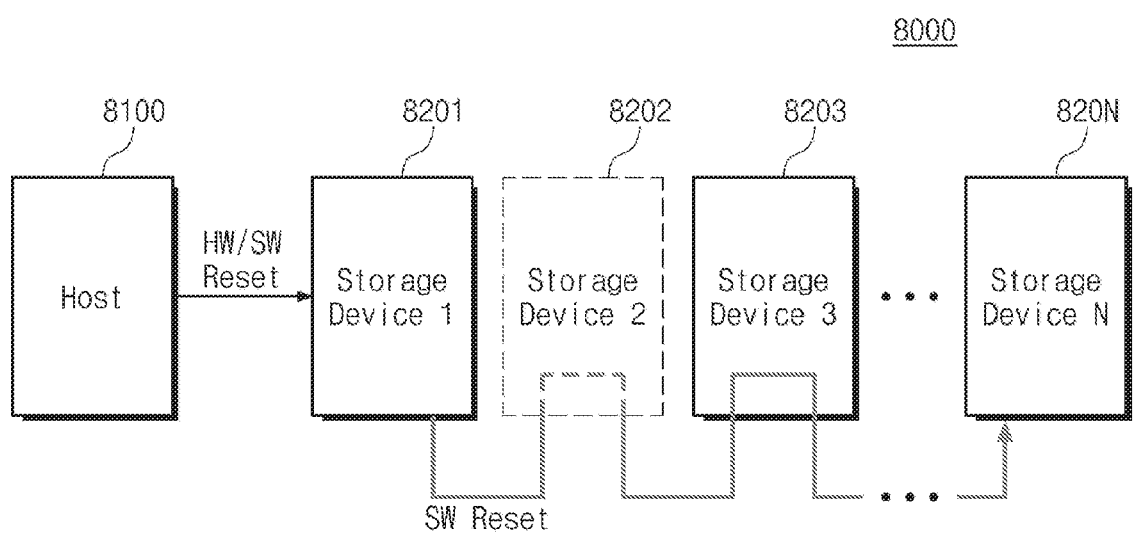
FIG. 16 is a block diagram for explaining the resetting of some of storage devices not directly connected to a host in a storage system according to at least some example embodiments of the inventive concepts.

FIG. 16 is a block diagram for explaining the resetting of some of storage devices (8202 to 820N) not directly connected to a host 8100 in a storage system 8000 according to at least some example embodiments of the inventive concepts. It is illustrated that a reset with respect to the second storage device 8202 is omitted.

In the present embodiment, when a hardware reset signal (HW Reset) is received from the host 8100 to the first storage device 8201, an identifier that can identify a storage device that it wants to reset may be received together with the hardware reset signal (HW Reset). The identifier may not include information that can identify the second storage device 8202.

A software reset signal (SW Reset) generated in response to the hardware reset signal (HW Reset) may be sequentially transmitted from the second storage device 8202 to the Nth storage device 820N. However, an application layer of the second storage device 8202 may not process the software reset signal (SW Reset) and the software reset signal (SW Reset) may simply bypass the application layer of the second storage device 8202. The same is true if the second storage device 8202 receives a response representing (i.e., indicating) that the third storage device 8203 is reset from the third storage device 8203. That is, an application layer of the storage device being reset can recognize and process the software reset signal (SW Reset) to reset the storage device but the second storage device 8202 which is not reset provides only a path through which the software reset signal (SW Reset) is transmitted so that subsequent storage devices (8203 to 820N) are reset.

Figure 17:
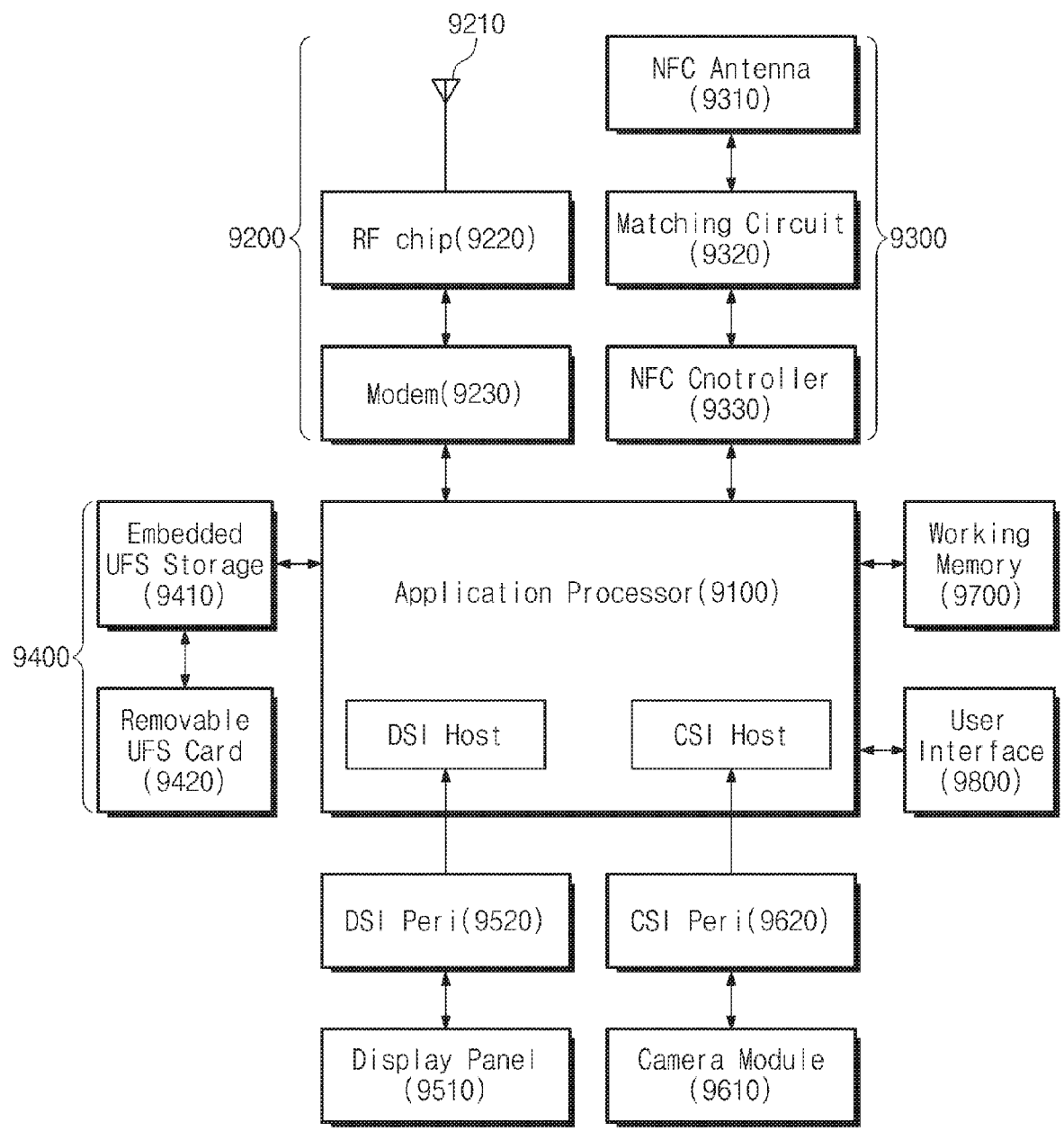
FIG. 17 is a block diagram illustrating an electronic device according to at least some example embodiments of the inventive concepts.

FIG. 17 is a block diagram illustrating an electronic device according to at least some example embodiments of the inventive concepts. Referring to FIG. 17, an electronic device 9000 may be configured to support a MIPI® standard or an eDP (embedded display port) standard. The electronic device 9000 may include an application processor 9100, a wireless transmit/receive unit 9200, an NFC communication unit 9300, a data storage 9400, a display unit 9500, an image processing unit 9600, a working memory 9700, and a user interface 9800.

The application processor 9100 can control an overall operation of the electronic device 9000. The application processor 9100 may include a DSI host that performs interfacing with the display unit 9500 and a CSI host that performs interfacing with the image processing unit 9600.

The wireless transmit/receive unit 9200 may include a main antenna 9210, a RF chip 9220, and a modem 9230. The modem 9230 may communicate with the application processor 9100 through an M-PHY® layer. However, in other embodiments, the modem 9230 is built in the application processor 9100 to be implemented in a single chip together with the application processor 9100. For example, the main antenna 9210 may be implemented in a portion of a metal body surrounding the electronic device 9000.

The NFC communication unit 9300 may include an NFC antenna 9310, a matching circuit 9320, and an NFC controller 9330.

The data storage 9400 may include an embedded UFS storage 9410 and a removable UFS card 9420. The embedded UFS storage 9410 may directly communicate with the application processor 9100 through the M-PHY® layer. The removable UFS card 9420 may be serially connected to the embedded UFS storage 9410. The application processor 9100, the embedded UFS storage 9410, and the removable UFS card 9420 may be connected in the form of topology of a chain structure or a cascade connection structure.

The application processor 9100 may include a bridge to communicate with the removable UFS card 9420 by a protocol different from a UFS protocol. The application processor 9100 may communicate with the removable UFS card 9420 by various card protocols (e.g., UFDs, MMC, eMMC SD (secure digital), mini SD, micro SD, etc.). The application processor 9100 and the removable UFS card 9420 may be constituted by a three-dimensional nonvolatile memory device in which a cell string including memory cells is formed in a direction perpendicular to a substrate.

The display unit 9500 may include a display panel 9510 and a DSI (display serial interface) peripheral circuit 9520. The display panel 9510 may display image data. A DSI host built in the application processor 9100 may perform a serial communication with the display panel 9510 through DSI. The DSI peripheral circuit 9520 may include a timing controller, a source driver, etc. needed to drive the display panel 9510.

The image processing unit 9600 may include a camera module 9610 and a CSI (camera serial interface) peripheral circuit 9620. The camera module 9610 and the CSI (camera serial interface) peripheral circuit 9620 may include a lens, an image sensor, an image processor, etc. Image data generated in the camera module 9610 may be processed in an image processor and the processed image may be transmitted to the application processor 9100 through CSI.

The working memory 9700 may temporarily store data processed by the application processor 9100. The working memory 9700 may include a volatile memory such as a SRAM, a DRAM, a SDRAM, etc. or a nonvolatile memory such as a flash memory, a PRAM (phase change RAM), a MRAM (magneto-resistive RAM), a ReRAM (resistive RAM), a FRAM (ferroelectric RAM), etc.

The user interface 9800 may include various devices (e.g., a mike, a speaker, etc.) provided for user convenience.

According to at least some example embodiments of the inventive concepts, in an electronic device including storage devices connected in a cascade connection structure, a method that can reset a removable storage device not directly connected to an application processor may be provided.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An electronic device comprising:
an application processor; and
a first storage device that is,
connected to the application processor and directly communicates with the application processor, and
connected to a second storage device such that the second storage device communicates with the application processor through the first storage device,
wherein the first storage device includes a reset converter configured to generate a software reset signal in response to a hardware reset signal received from the application processor, and
wherein the software reset signal resets the second storage device.

2. The electronic device of claim 1, wherein the software reset signal includes information for identifying the second storage device to be reset by the software reset signal.

3. The electronic device of claim 1, wherein the first storage device is configured such that the first storage device is reset by the hardware reset signal after the second storage device is reset.

4. The electronic device of claim 1, wherein the first storage device is configured to reset according to a response, received from the second storage device, indicating that the second storage device has been reset.

5. The electronic device of claim 1, wherein the first storage device is configured such that the reset converter generates the software reset signal after the first storage device is reset in response to the hardware reset signal.

6. The electronic device of claim 1, wherein,
the application processor includes first reset pins,
the first storage device includes second reset pins,
the electronic device further includes a line that connects the first reset pins to the second reset pins, and
the application processor is configured to transmit the hardware reset signal to the first storage device through the line.

7. The electronic device of claim 1, wherein the first storage device comprises:
a controller,
wherein the controller includes,
a physical layer configured to transmit packets to, and receive packets from, the application processor and the second storage device,
a link layer configured to transmit and convert packet received through the physical layer, and
an application layer configured to provide a communication service on the first storage device based on packets received through the link layer.

8. The electronic device of claim 7, wherein the physical layer is implemented according to a MIPI® M-PHY® protocol, the link layer is implemented according to a MIPI® UniPro$^{SM}$ protocol, and each of the first and second storage devices is implemented according to a MIPI® universal flash storage (UFS) protocol.

9. The electronic device of claim 1, wherein the first storage device is an embedded storage device, and
wherein the second storage device is a removable storage device.

10. An embedded storage device configured to connect to, and directly communicate with, an application processor, the embedded storage device comprising:
a reset converter configured to generate a software reset signal in response to a hardware reset signal received from the application processor,
wherein the reset converter is configured to transmit the software reset signal to a removable storage device,
wherein the embedded storage device is connected to, and configured to directly communicate with, the removable storage device, and
wherein the embedded storage device is configured to be a connection between the removable storage device and the application processor.

11. The embedded storage device of claim 10, wherein the software reset signal includes information for identifying a storage device connected to the application processor through the embedded storage device.

12. The embedded storage device of claim 10, wherein the hardware reset signal is received through a separate line that connects reset pins included in the application processor and the embedded storage device respectively.

13. The embedded storage device of claim 10, wherein the embedded storage device is configured to reset according to a response, received from the removable storage device, indicating that the removable storage device has been reset.

14. The embedded storage device of claim 10, further comprising:
a controller,
wherein the controller includes,
a physical layer configured to transmit packets to, and receive packets from, the application processor and the removable storage device;
a link layer configured to transmit and convert packets received through the physical layer; and
an application layer configured to provide a communication service based on packets received through the link layer.

15. The embedded storage device of claim 14, wherein the physical layer is implemented according to a MIPI® M-PHY® protocol, the link layer is implemented according to a MIPI® UniPro protocol, and the embedded storage device is implemented according to a MIPI® UFS protocol.

16. An electronic device comprising:
an application processor;
one or more first signal lines;
a first storage device connected to the application processor by the one or more first signal lines such that the first storage device is configured to receive a first reset signal from the application processor through the one or more first signal lines; and one or more second signal lines that are connected to the first storage device and connectable to a second storage device, wherein, the first storage device is configured such that, while the first storage device is connected to the second storage device by the one or more second signal lines, the first storage device generates a second reset signal based on the first reset signal, and the first storage device sends the second reset signal to the second storage device via the one or more second signal lines, the second reset signal being a signal configured to cause the second storage device to perform a reset operation.

17. The electronic device of claim 16 wherein the electronic device is configured such that the second storage device is insertable and removable with respect to the electronic device.

18. The electronic device of claim 16, wherein the first storage device is configured to reset according to a signal indicating that the second storage device has been reset.

19. The electronic device of claim 16, wherein the first storage device is configured to reset in response to the first reset signal.

20. The electronic device of claim 19, wherein the first storage device is configured to send the second reset signal to the second storage device after the first storage device resets in response to the first reset signal.

* * * * *